(12) United States Patent
Shouji et al.

(10) Patent No.: US 9,812,288 B2
(45) Date of Patent: Nov. 7, 2017

(54) SAMPLE HOLDER WITH LIGHT EMITTING AND TRANSFERRING ELEMENTS FOR A CHARGED PARTICLE BEAM APPARATUS

(71) Applicant: HITACHI HIGH-TECHNOLOGIES CORPORATION, Minato-ku, Tokyo (JP)

(72) Inventors: Minami Shouji, Tokyo (JE); Takashi Ohshima, Tokyo (JP); Yuusuke Oominami, Tokyo (JP); Hideo Morishita, Tokyo (JP); Kunio Harada, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 15/119,950

(22) PCT Filed: Jan. 9, 2015

(86) PCT No.: PCT/JP2015/050426
§ 371 (c)(1),
(2) Date: Aug. 18, 2016

(87) PCT Pub. No.: WO2015/125511
PCT Pub. Date: Aug. 27, 2015

(65) Prior Publication Data
US 2017/0069458 A1    Mar. 9, 2017

(30) Foreign Application Priority Data

Feb. 19, 2014 (JP) .................................. 2014-029106

(51) Int. Cl.
*H01J 37/20* (2006.01)
*H01J 37/16* (2006.01)
(Continued)

(52) U.S. Cl.
CPC ............ *H01J 37/244* (2013.01); *H01J 37/20* (2013.01); *H01J 37/26* (2013.01); *H01J 2237/2445* (2013.01); *H01J 2237/2808* (2013.01)

(58) Field of Classification Search
CPC .......... H01J 37/20; H01J 37/16; H01J 37/224; H01J 37/228; G01N 23/2204; G01N 23/2251
(Continued)

(56) References Cited

U.S. PATENT DOCUMENTS 7,745,786 B2 * 6/2010 Fama .................... H01J 37/224
                                                          250/309
9,418,818 B2 * 8/2016 Ominami ................ H01J 37/16
(Continued)

FOREIGN PATENT DOCUMENTS

JP    10-283978 A    10/1998

*Primary Examiner* — David A Vanore
(74) *Attorney, Agent, or Firm* — Miles & Stockbridge P.C.

(57) ABSTRACT

The objective of the present invention is to simply perform image observation through transmitted charged particles. A sample irradiated by a charged particle beam is disposed directly or via a predetermined member on a light-emitting element (23) whereinto charged particles that have traversed or scattered inside the sample enter, causing a light to be emitted therefrom, which is collected and detected efficiently using a light transmission means (203) to generate a transmission charged particle image of the sample.

18 Claims, 24 Drawing Sheets

(51) Int. Cl.
*H01J 37/244* (2006.01)
*H01J 37/26* (2006.01)

(58) Field of Classification Search
USPC ........... 250/440.11, 307, 310, 311, 309, 397, 250/472.1, 484.4
See application file for complete search history.

(56) References Cited

U.S. PATENT DOCUMENTS

| | | | |
|---|---|---|---|
| 9,431,211 B2* | 8/2016 | Sharma | H01J 37/226 |
| 9,472,375 B2* | 10/2016 | Ominami | H01J 37/16 |
| 9,508,527 B2* | 11/2016 | Ominami | H01J 37/16 |
| 2005/0199826 A1* | 9/2005 | Saito | G01T 1/2012 |
| | | | 250/484.4 |
| 2010/0102248 A1* | 4/2010 | Milas | H01J 37/20 |
| | | | 250/440.11 |
| 2011/0284745 A1* | 11/2011 | Nishiyama | G01N 23/2204 |
| | | | 250/307 |
| 2015/0318143 A1* | 11/2015 | Ominami | H01J 37/16 |
| | | | 250/307 |
| 2016/0011110 A1* | 1/2016 | Kojima | H01J 37/244 |
| | | | 250/458.1 |
| 2016/0025659 A1* | 1/2016 | Ominami | H01J 37/20 |
| | | | 250/307 |
| 2016/0329188 A1* | 11/2016 | Ominami | H01J 37/244 |
| 2017/0069458 A1* | 3/2017 | Shouji | H01J 37/20 |

* cited by examiner

F I G . 11
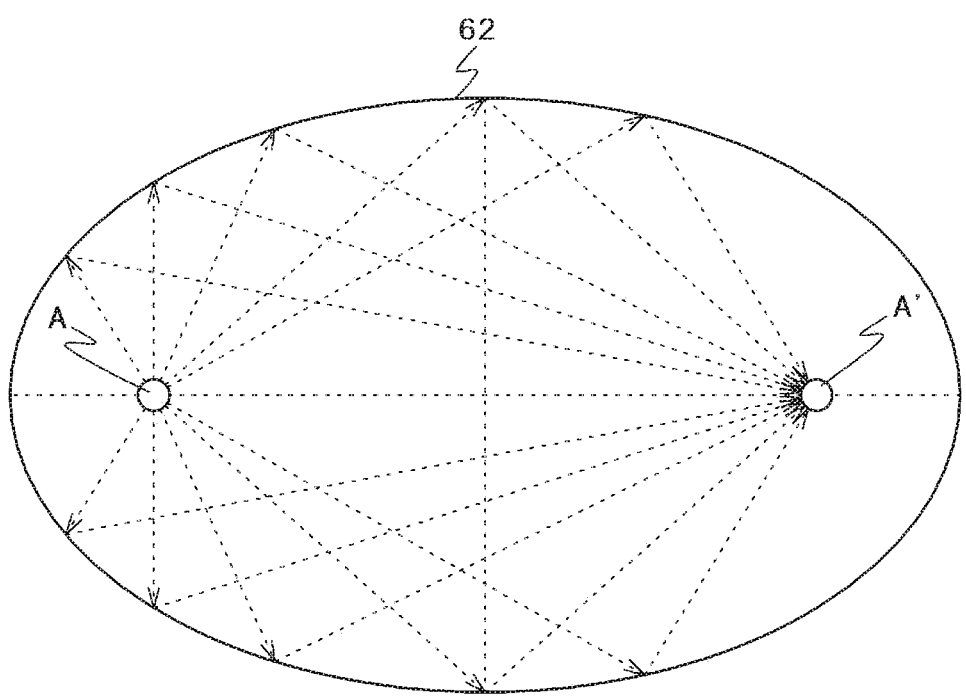

SAMPLE HOLDER WITH LIGHT EMITTING AND TRANSFERRING ELEMENTS FOR A CHARGED PARTICLE BEAM APPARATUS

TECHNICAL FIELD

The present invention relates to a charged particle beam apparatus that allows the interior of a sample to be observed and a sample support of the same.

BACKGROUND ART

A scanning transmission electron microscope (STEM), a transmission electron microscope (TEM), or the like (hereafter, collectively referred to as (S)TEM) is used to observe the internal structure of a minute region of a substance. To observe the interior of a sample with one of these electron microscopes, a method is generally known. In this method, a sample sliced so thin that a charged particle beam can traverse is placed on a mesh sample support with a large number of holes; and a transmitted charged particle beam image is acquired with a detector disposed on the side opposite the electron source side with respect to a sample surface. In this configuration, however, a sample is suspended over the mesh hole area and thus it is difficult to prepare a sample such that an intended observation target is positioned over the mesh hole area. To cope with this, Patent Literature 1 proposes an electron detector that enables direct placement of a sample for observation with an electron microscope.

As well as a charged particle beam microscope, an optical microscope can also be used as a means for observing a minute region of a substance. Use of an optical microscope makes it possible to acquire the color information of a sample that theoretically cannot be acquired with an electron microscope. Optical microscopes are designed to irradiate a sample with white light or specific light and form an image from transmitted light having color information, absorbed into or emitted from the sample. By applying this, for example, introducing a specific stain into a biological cell sample, a specific region in the cell can be stained; therefore, a distribution of stained regions and non-stained regions can be visualized by extracting associated color information. This technique is in wide use, especially, in the fields of pathological diagnosis and life science.

With a charged particle beam microscope, color information cannot be acquired but high-resolution observation of a minute region that is difficult with an optical microscope can be performed. In addition, a charged particle beam microscope makes it possible to obtain information reflecting a density difference in a sample as well.

CITATION LIST

Patent Literature

PTL 1: Japanese Patent Application Laid-Open No. 10(1998)-283978

SUMMARY OF INVENTION

Technical Problem

In a detector-sample support in Patent Literature 1, a sample is placed directly on an electrical system wired with a semiconductor, a metal film, or the like through electric wiring or the like. Since this detector-sample support is connected with wiring, the electric wiring need be removed to observe an identical sample with a different apparatus. To observe a cultured cell, it is necessary to culture a sample itself on a sample support for microscope observation beforehand. However, when it is attempted to culture a sample on this detector-sample support, it is necessary to immerse a circuit connected with electric wiring for applying high voltage in a culture solution or the like; and it can be difficult to place an intended observation target on the detector-sample support. In the prior art, as mentioned above, it used to take much time to place or take out a sample in observation with transmitted charged particles.

The present invention has been made in consideration of the above problems and it is an object of the present invention to provide a charged particle beam apparatus that enables simple image observation with transmitted charged particles, a sample observation method, a sample support, an observation system, and a light emitting element.

Solution to Problem

To address the above problems, a sample holder of the present invention includes: a sample placement portion on which a light emitting member caused to emit light by charged particles that have traversed or scattered inside a sample is placed; and a light transferring member forming a light transfer path through which light launched from a surface non-parallel to the surface of the light emitting member on which the sample is placed is transferred toward a detector. Alternatively, a sample holder of the present invention includes: a sample placement portion on which a light emitting member caused to emit light by charged particles that have traversed or scattered inside a sample placed thereon is placed; and a light gathering means that gathers light from the light emitting member toward a detector.

An observation system of the present invention includes: a charged particle beam source that generates a charged particle beam; a light emitting member caused to emit light by charged particles that have traversed or scattered inside a sample; a detector that detects light launched from a surface of the light emitting member non-parallel to a surface on which a sample is placed; and an image generation portion that generates an image of a sample based on a signal from the detector.

An image generation method of the present invention includes the steps of: applying a charged particle beam to a sample placed on a light emitting member caused to emit light by charged particles; launching light generated from the light emitting member by charged particles that have traversed or scattered inside a sample from a surface of the light emitting member non-parallel to a surface on which the sample is placed; transferring launched light toward a detector; detecting transferred light with the detector; and generating an image of a sample based on a signal from the detector.

Advantageous Effects of Invention

According to one aspect of the present invention, image observation with transmitted charged particles can be easily performed by causing a light emitting element with a sample placed thereon to emit light and effectively guiding the emitted light to a detector by a light transferring means. Other problems, configurations, and effects will be apparent from the description of the following embodiments.

BRIEF DESCRIPTION OF THE DRAWINGS

FIG. 11 is an explanation drawing of characteristics of an elliptical mirror.

FIGS. 15A to 15B, 15C1 to 15C2 and 15D1 to 15D2 are detail drawings of the tip shape of a sample unit for side entry type in Example 3.

DESCRIPTION OF EMBODIMENTS

Figure 1:
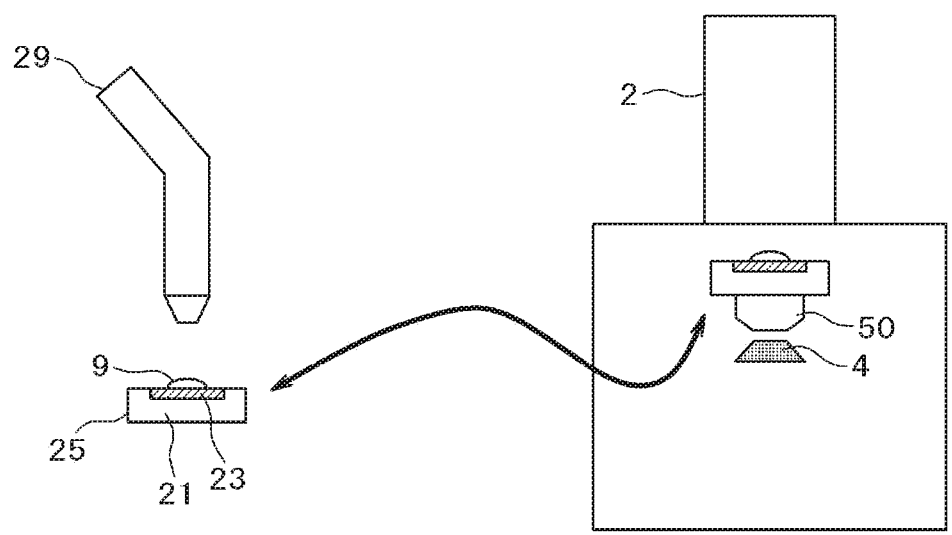
FIG. 1 is a schematic explanation drawing of optical microscope observation and charged particle beam microscope observation.

Hereafter, a description will be given to each embodiment with reference to the drawings.

Hereafter, a description will be given to the details of a sample support unit 24 of the present invention and a charged particle beam apparatus 36 to which the sample support unit is applied. However, these are just examples of the present invention and the present invention is not limited to the embodiments described below. The present invention is applicable to apparatuses designed to observe a sample by applying a charged particle beam 35 thereto. Examples of such apparatuses include: scanning electron microscopes, scanning ion microscopes, scanning transmission electron microscopes, composite apparatuses obtained by combining these microscopes with sample processing equipment, or analysis and inspection instruments to which these microscopes are applied. The sample support unit 24 of the present invention and the charged particle beam apparatus 36 on which the sample support unit 24 is placed constitute an observation system with which a transmitted charged particle beam image can be observed.

"Sample support" cited in this specification refers a member for securing a light emitting element 23, located at the lower part or on a side of the light emitting element. "Sample support unit" refers a unit that can be removed together with a sample from a charged particle beam apparatus with the sample placed thereon. As described below, specifically, the "sample support unit" may be constructed of a light emitting element 23, a sample support 25, and a light gathering means or may be constructed only of a light emitting element. A "sample stage" may be constructed of a sample support unit, a photodetector, and the like or may be constructed only of a light emitting element and refers to a structure that enables shifting of an observation field in the sample chamber of a charged particle beam apparatus 2. Any sample 9, including a biological sample, a polymeric material, and the like, is acceptable as long as the sample allows the passage of a primary charged particle beam.

EXAMPLE 1

First, a description will be given to the general outline of this example. In the description of this example, a charged particle microscope and an observation system will be taken an example. In the microscope and system, a charged particle beam that have traversed or scattered inside a sample is converted into light and this light is detected, thereby generating a transmitted charged particle beam image. More specifically, at least a part of a sample support on which a sample is placed is formed of a light emitting element that is caused to emit light by application of a charged particle beam. When a charged particle beam that have traversed or scattered inside the sample on the light emitting element is applied to the light emitting element, light is generated. By detecting this light with a detector provided in a charged particle microscope, a transmitted charged particle beam image is generated. That is, in this example, a charged particle beam that passed through a sample is not directly detected but is converted into light and then detected. As described in detail below, the light emitting element that converts a charged particle beam into light does not require wiring, such as a power cable or a signal wire, connected from an external source. For this reason, an identical sample support can be used for observation with a charged particle beam microscope and with other apparatuses and it is unnecessary to remove and attach electric wiring when a sample is moved from apparatus to apparatus. Since the light emitting element or the sample support including the light emitting element can be easily detached and attached, any sample can be placed on the sample support. This configuration is effective especially in observing a cultured cell or the like for which a sample itself must be cultured on a sample support for microscope observation.

When a sample support 25 in this example is used, as illustrated in FIG. 1, the identical sample support 25 can be used for observation with a charged particle beam microscope and for observation with a different apparatus, such as an optical microscope 29. FIG. 1 illustrates: the sample support 25 including the light emitting element 23 (also referred to as detecting element) in this example capable of converting or amplifying a charged particle beam into light and being caused to emit light and a supporting member 21 for supporting the light emitting element 23; a light gathering means 50 for gathering light from the light emitting element; a photodetector 4; a charged particle beam microscope 2; and an optical microscope 29. A sample 9 is placed on the sample support 25.

In this example, it is desirable that the light emitting element 23 provided in the sample support 25 should be made of a transparent member. "Transparent" cited in this specification refers to that visible light or ultraviolet light or infrared light in a specific wavelength range can pass or that visible light or ultraviolet light or infrared light in every wavelength range can pass. Ultraviolet light is approximately 10 to 400 nm in wavelength; visible light is approximately 380 nm to 750 nm in wavelength; and infrared light is approximately 700 nm to 1 mm (=1000 μm) in wavelength. For example, when a color is slightly mixed but the other side can be seen through, visible light in a specific wavelength range can pass; when something is transparent and colorless, visible light in every wavelength range can pass. "Can pass" cited herein refers to that light in a light quantity observable with the optical microscope 29 by the light in the relevant wavelength range passes. A transmittance of 50% or above is typically desirable.

Specific wavelength range cited herein is a wavelength range including at least a wavelength range used for observation with the optical microscope 29. For this reason, it is possible to use a "light transmission signal" obtained by the passage of light from one side of the sample support 25 in this example through the sample 9 for the ordinary optical microscope 29. In the ordinary optical microscope 29 (typically, transmission optical microscope 29), the light transmission signal can be detected from another side of the sample support 25. Any microscope can be used for the optical microscope 29 as long as the microscope utilizes light for image observation. Examples of such microscopes include biological microscopes, stereoscopic microscopes, inverted microscopes, metallurgical microscopes, fluorescence microscopes, laser microscopes, and the like. Though the term "optical microscope" is used herein for the sake of explanation, the present invention is generally applicable to apparatuses designed to acquire information by applying light to a sample 9 regardless of the enlargement ratio of an image.

In this example, a charged particle beam generated in the charged particle beam microscope 2 is applied to a sample. A "transmitted charged particle signal" that thereafter traversed or scattered inside the sample 9 is converted into light by the light emitting element 23 provided in the sample support 25 and the light is detected. A transmitted charged particle microscope image can be thereby acquired.

Obtained information is different between the charged particle beam microscope 2 and the optical microscope 29. In recent years, therefore, there is an increasing demand for observing an identical sample 9 in an identical visual field both in a charged particle beam microscope 2 and in an optical microscope 29. However, for example, light cannot pass through the detector-sample support in Patent Literature 1 and observation is substantially difficult with an optical microscope 29; therefore, the sample support is dedicated to a charged particle beam microscope. For this reason, it is necessary to separately prepare a sample 9 for the charged particle beam microscope and a sample 9 for the optical microscope 29 and this poses problems of time-consuming sample preparation and the like.

Hereafter, a description will be given to the details of a sample support unit, a sample placement method, a principle of image acquisition, an apparatus configuration, and the like.

Figure 2:
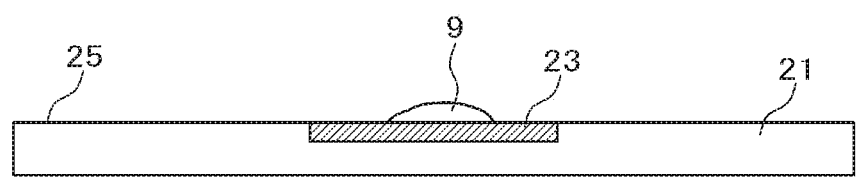
FIG. 2 is a detail drawing of a sample support with a detecting element.

A detailed description will be given to the sample support 25 in this example with reference to FIG. 2. The sample support 25 in this example is constructed of: the light emitting element 23 that converts a charged particle beam into light; and a supporting member 21 (also referred to as transparent member when this member is transparent) that supports the same. To use an identical sample support for observation with the optical microscope 29 and observation with the charged particle microscope, it is desirable that the sample support 25 including the light emitting element 23 and the supporting member 21 should be transparent. A sample is placed directly on the light emitting element 23. Alternatively, a sample may be indirectly placed through a member such as a membrane as described later. Though it is desirable that the supporting member 21 should be transparent and colorless, color may be slightly mixed. Examples of the material of the supporting member 21 include transparent glass, transparent plastic, transparent crystallization, and the like. In cases where observation is performed with a fluorescence microscope or the like, it is desirable that fluorescence should not be absorbed and thus transparent plastic is preferable. In the case of the sample support 25 in this example, optical microscope observation can be performed when the light emitting element 23 and the supporting member 21 located between the following place and surface are "transparent": a place where the sample 9 is placed and a surface of the sample support 25 opposite the place where the sample 9 is placed. As described later, the supporting member 21 is not an indispensable configuration.

The light emitting element 23 is an element that detects a primary charged particle beam coming in with energy of, for example, several keV to several hundreds of keV. When irradiated with a primary charged particle beam, the light emitting element emits light, such as visible light, ultraviolet light, infrared light, or the like. When used in the sample support 25 in this example, the light emitting element 23 converts charged particles that have traversed or scattered inside the sample 9 placed on the sample support 25 into light. Examples of the light emitting element 23 include scintillator, luminescence light emitting material, YAG (yttrium aluminum garnet) element, YAP (yttrium aluminum perovskite) element, and the like. The emission wavelength only has to be in a specific or any wavelength rang of visible light, ultraviolet light, or infrared light. Examples of scintillator include inorganic scintillator formed of an inorganic material, such as SiN, plastic scintillator or organic scintillator contained in a material, such as polyethyleneterephthalate, capable of emitting light, material to which liquid scintillator contained in anthracene or the like is applied, and the like. The light emitting element 23 may be formed of any material as long as the element is capable of converting a charged particle beam into light.

The light emitting element 23 need not be a detachable solid. The light emitting element may be a thin film coated with a fluorescent agent that produces luminescence when irradiated with a charged particle beam or fine particles that are absorbed into a sample and emit light when irradiated with a charged particle beam. In the description of this example, members, including the above-mentioned members, that generate light when they receive charged particles will be collectively referred to as light emitting element 23. The in-solid mean free path of a charged particle beam depends on the acceleration voltage (irradiation energy) of the charged particle beam and is several tens of nm to several tens of μm. For this reason, a light emission region in the light emitting element 23 is substantially identical with a region a charged particle beam that passed through the sample 9 enters. Therefore, to efficiently collect light generated at the light emitting element 23, the thickness of the light emitting element 23 only has to be larger than the depth to which a charged particle beam passing through the sample 9 enters the light emitting element 23. Meanwhile, to use an identical sample support for observation with the optical microscope 29, it is necessary to cause as many optical signals as possible to pass. For this reason, when a light emitting element 23 with color slightly mixed is used, it is preferable to use a thinner light emitting element 23.

Examples of the photodetector 4 used in the present invention include photodiode and photomultiplier (also referred to as PMT). These items will be described later.

The photodiode has various advantages, for example, it is operable with simple circuitry, it is of a small size and is not limited by installation location so much, and it produces less noises. Meanwhile, the photodiode involves disadvantages of weak output signals and low S/N. For this reason, when a photodiode is used as a detector, it is advisable to install a preamplifier for amplifying output currents in proximity to the detector.

The photomultiplier is an element capable of converting light incident from a detection surface into photoelectrons and detecting these electrons with an amplification factor of substantially six digits at maximum via a dynode. Since the detector itself has an amplifying function, it has an advantage that it can intensify signals and its detection sensitivity can be adjusted with the applied voltage of the dynode. Because of the foregoing, when a photomultiplier is used to observe a sample containing many structures different in the transmittance of a charged particle beam, a wide variety of sample information can be obtained by varying the detection sensitivity of the photomultiplier. However, the photomultiplier also involves disadvantages. It is larger in size than photodiodes and is low in the degree of freedom of installation. Further, it is necessary to apply a voltage of approximately 1 kV for sensor operation and when the photomultiplier is used, a feedthrough for high-voltage wiring or a shielded wire preventing the leakage of electric fields is connected from an external source. Though there is also a sensor mounted with a combination of a high-voltage multiplier tube and a circuit for high voltages, it further increases a size and is subject to the limitation of installation location.

The photodetector may be a detector having an amplifying function like a photomultiplier or may be a detector having only a function of converting light into a current like a photodiode.

The light gathering means 50 is a means that gathers light obtained by a charged particle beam that passed through a sample being converted by the light emitting element 23 and allows the light to be detected at the detection surface 5 of the photodetector 4. Specifically, the light gathering means is a member installed such that variation in the light quantity of light gathered at the detection surface 5 of the photodetector 4 is minimized even in the following case: a case where to shift a visual field or vary a tilt angle, the sample support stage is moved (on an XY-axis, Z-axis, or tilting rotation axis, θ-axis). This is implemented mainly with an optical lens, a Fresnel lens, a prism, a mirror, a combination thereof, or the like. Variation in detected light quantity can be minimized by designing and fabricating a light gathering means suitable for the structure of the sample support unit and applying the same.

The light transfer path 203 may be simply a space or may be a light transferring substance, such as glass, quartz, and plastic, capable of transferring light from the light emitting element 23. A member forming at least a part of the light transfer path will be designated as a light transferring member. The light transferring member is a light transferring substance such as a support 33 or a light guide, for example. When a light gathering member such as a lens or a reflecting member such as a mirror is placed at some midpoint in the light transfer path, these members are also included in the light transferring member.

Figure 5:
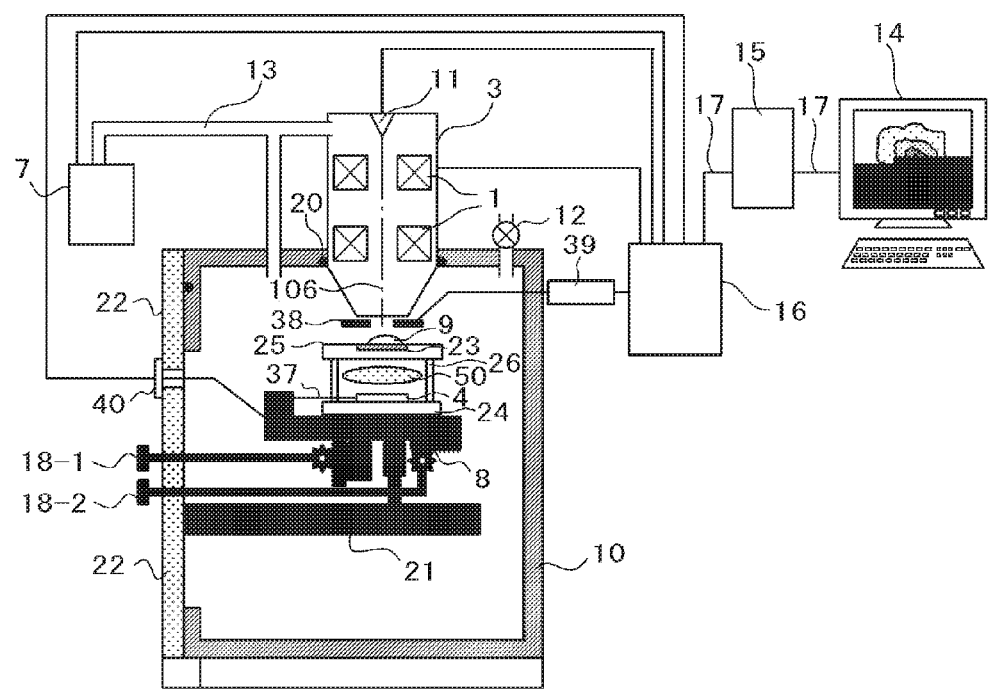
FIG. 5 is an overall block diagram of charged particle microscope observation in Example 1.

FIG. 5 illustrates an example of the configuration of an apparatus obtained by mounting a common charged particle beam apparatus with a sample support unit 24 in this example. The charged particle microscope 2 is constructed mainly of: an enclosure 10 (hereafter, also referred to as vacuum chamber) for supporting a charged particle optical lens tube on the apparatus installation face; and a control system for controlling these members. In the charged particle microscope 2, the internal pressure of the sample chamber of the charged particle optical lens tube 3 and the enclosure 10 is controlled with a vacuum pump 7. Starting and stopping operations of the vacuum pump 7 are also controlled by the control system. In FIG. 5, only one vacuum pump 7 is depicted but two or more vacuum pumps are also acceptable.

The charged particle optical lens tube 3 is constructed of elements including: a charged particle source 11 for generating a primary charged particle beam; and a lens 1 for focusing the generated charged particle beam and guiding the same to the lower part of the lens tube and converging the primary charged particle beam on the sample. The charged particle optical lens tube 3 is installed such that the lens tube is protruded into the enclosure 10 and is secured on the enclosure 10 through a vacuum sealing member 20. At an end of the charged particle optical lens tube 3, a detector 38 is placed for detecting secondary charged particles obtained by applying the primary charged particle beam 35. (When the charged particle beam apparatus is an electron microscope, secondary electrons, reflected electrons, or the like is detected.) The detector 38 need not be installed in the position shown in the drawing and may be installed anywhere in the enclosure 10.

Secondary charged particles, such as reflected charged particles and transmitted charged particles are released from the interior or surface of a sample 9 by a charged particle beam that arrived at the sample 9. These secondary charged particles are detected at the detector 38. The detector 38 is an element capable of detecting and amplifying a charged particle beam coming in with an energy of several keV to several hundreds of keV. Examples of the detector include semiconductor detectors made of a semiconductor material, such as silicon, scintillators capable of converting charged particle signals into light at or under a glass surface, and the like.

The charged particle microscope in this example includes as a control system: a computer 14 used by an apparatus user; a higher-level control unit 15 that is connected and communicates with the computer 14; and a lower-level control unit 16 that controls an evacuation system, a charged particle optical system, and the like in accordance with instructions transmitted from the higher-level control unit 15. The computer 14 includes a monitor for displaying an apparatus operating screen (GUI) and an input means, such as a keyboard and a mouse, for input to the operating screen. The higher-level control unit 15, lower-level control unit 16, and computer 14 are connected with one another through a communication wire 17.

The lower-level control unit 16 is a part that transmits and receives control signals for controlling the vacuum pump 7, charged particle source 11, lens 1, and the like. Further, the lower-level control unit converts output signals of the detector 38 into digital image signals and transmits the signals to the higher-level control unit 15. In the drawing, output signals from the detector 38 are connected to the lower-level control unit 16 by way of an amplifier 28, such as a preamplifier 39. The amplifier may be omitted if unnecessary.

In the higher-level control unit 15 and the lower-level control unit 16, an analog circuit, a digital circuit, and the like may be coresident with one another and the higher-level control unit 15 and the lower-level control unit 16 may be integrated into one. The configuration of the control system illustrated in FIG. 5 is just an example and modifications to a control unit, a valve, a vacuum pump 7, communication wiring, and the like belong to the scope of the charged particle beam microscope 2 in this example as long as the modifications fulfil the functions intended in this example.

The enclosure 10 is connected with a vacuum pipe 13 one end of which is connected to the vacuum pump 7 and thus the interior of the enclosure can be kept under vacuum. In addition, a leak valve 12 is provided for opening the interior of the enclosure 10 to the atmosphere and the interior of the enclosure 10 can be opened to the atmosphere when the sample support unit 24 is introduced into the apparatus. The leak valve 12 may be omitted and two or more leak valves may be provided. The installation location of the leak valve 12 in the enclosure 10 is not limited to that shown in FIG. 5 and the leak valve may be placed elsewhere on the enclosure 10.

The enclosure 10 is provided in a side thereof with an opening 40 and a lid member 22 provided at the opening 40 and a vacuum sealing member 20 maintain the vacuum hermeticity of the interior of the apparatus. As mentioned above, the charged particle microscope 2 in this example is provided with a sample stage 8. The sample stage 8 is for changing the positional relation between a sample 9 and the charged particle optical lens tube 3 after the sample 9 placed on the sample support 25 is introduced into the enclosure 10. The above-mentioned light emitting element 23 or the sample support 25 including the light emitting element 23 is placed on the sample stage 8 such that these members are detachable. A supporting member 21 that functions as a bottom plate supported by the lid member 22 is provided and the stage 8 is secured on the supporting member 21. The stage 8 is provided with an XY drive mechanism for an in-plane direction, a Z-axis drive mechanism for a height direction, and the like. The supporting member 21 is attached such that the supporting member is extended inward of the enclosure 10 toward a surface opposite the lid member 22. Respective spindles are extended from the Z-axis drive mechanism and the XY drive mechanism and respectively coupled with an operation knob 18-1 and an operation knob 18-2 provided in the lid member 22. An apparatus user can operate these operation knobs 18-1, 18-2 to adjust the position of the sample 9. As described later, the present invention may be configured such that an optical microscope 29 is provided above the lid member 22.

The sample support 25 provided with the light emitting element 23 can be placed on the sample stage 8. At the light emitting element 23, as mentioned above, a charged particle beam is converted into light. A photodetector 4 for detecting this light, converting it into electrical signals, and amplifying the signals is provided on or in proximity to the sample stage outside the enclosure 10.

The performance of the light emitting element 23, sample support unit 24, sample support 25, and light gathering means 50 is not pertinent to the inner atmosphere of the apparatus; therefore, the apparatus is usable under various degree-of-vacuum conditions ranging from atmospheric pressure to high vacuum.

Figure 4:
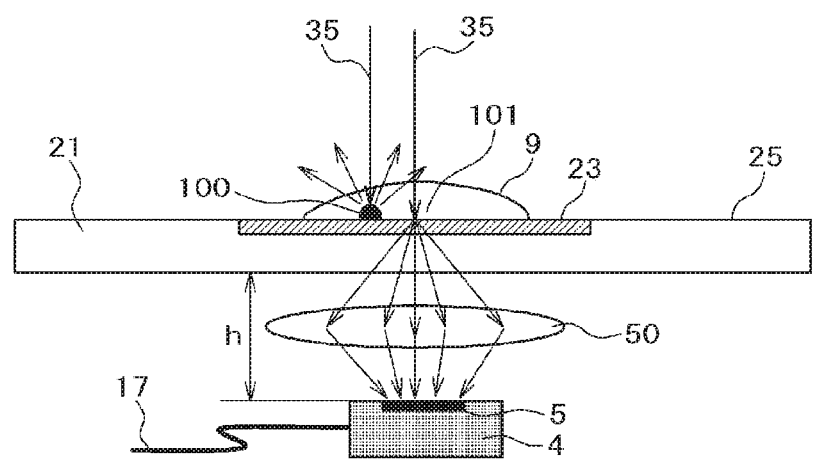
FIG. 4 is an explanation drawing of a basic principle of detection.
Figure 4:
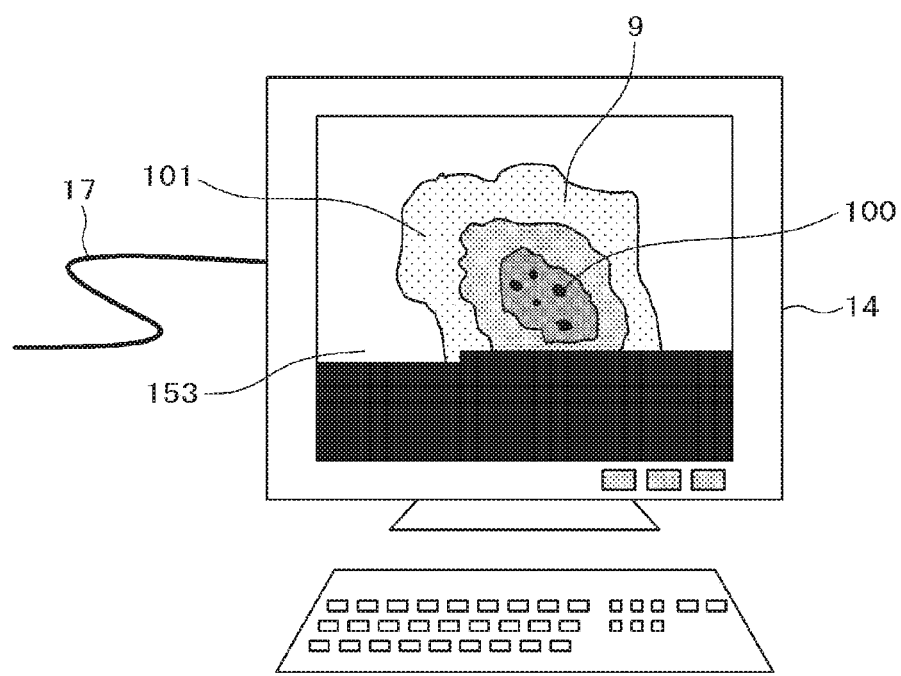

Hereafter, a description will be given to a light detection method and a principle of acquisition of a transmitted charged particle beam image using a sample support in this example. FIG. 4 illustrates how a sample 9 is placed on the light emitting element 23. A photodetector 4 is depicted under the sample support 25. The photodetector 4 is capable of converting or amplifying optical signals from the light emitting element 23 into electrical signals. A light gathering means 50 is provided to bring as much emitted light as possible to the photodetector 4. The light gathering means 50 is implemented by an optical lens, a Fresnel lens, a prism, a mirror, a combination thereof, or the like and is disposed to gather diverged light 108 coming out of the light emitting element 23. The electrical signals obtained by conversion or amplification are inputted to a control unit or a computer 14 through a communication wire 17 and imaged by these control systems to form a transmitted charged particle beam image 153. This transmitted charged particle beam image 153 is outputted to a monitor or the like as required.

For the space area (shown by h in the drawing) between the photodetector 4 and the sample support 25, an optimum range is determined such that light can be efficiently detected as much as possible depending on the light gathering means

50. For example, when a convex lens is used as the light gathering means, the optimum range refers to a focal length at which emitted light from the light emitting element can be gathered most at the detection surface of the detector.

Here, it is assumed that there are a high-density region 100 and a low-density region 101 in a sample. When the high-density region 100 in the sample is irradiated with a primary charged particle beam 35, part of the charged particle beam is back-scattered; therefore, the number of transmitted charged particles arriving at the light emitting element 23 is small. Meanwhile, when the low-density region 101 in the sample is irradiated with a primary charged particle beam 35, much of the charged particle beam is not scattered and passes to the light emitting element 23. As a result, a density difference in the sample 9 can be detected with the light emitting element 23. At this time, the amount of a charged particle beam that passes depends on the energy of the applied charged particle beam 35. For this reason, internal information to be observed and a region to be observed can be changed by varying the energy of the charged particle beam.

Figure 19A:
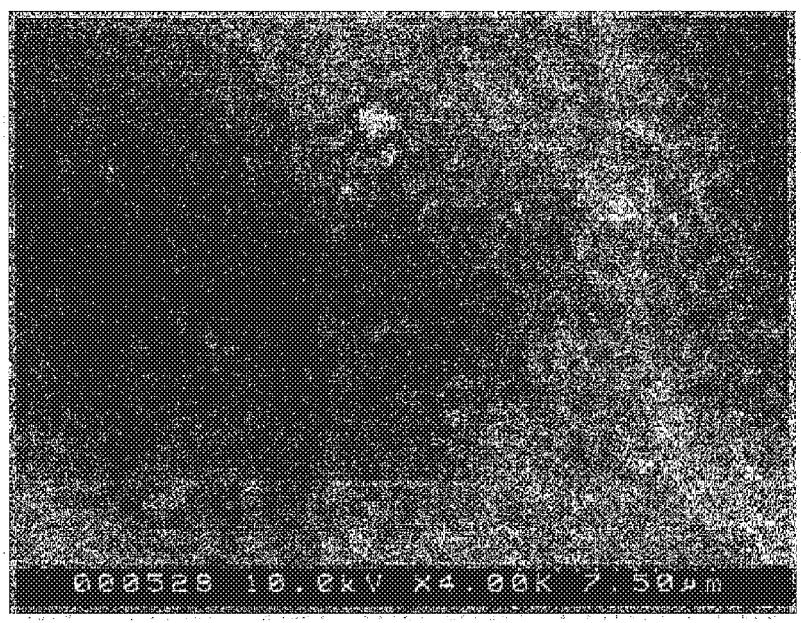
FIGS. 19A to 19B are observational photos of a surface image and a transmission image of a biological sample.
Figure 19B:
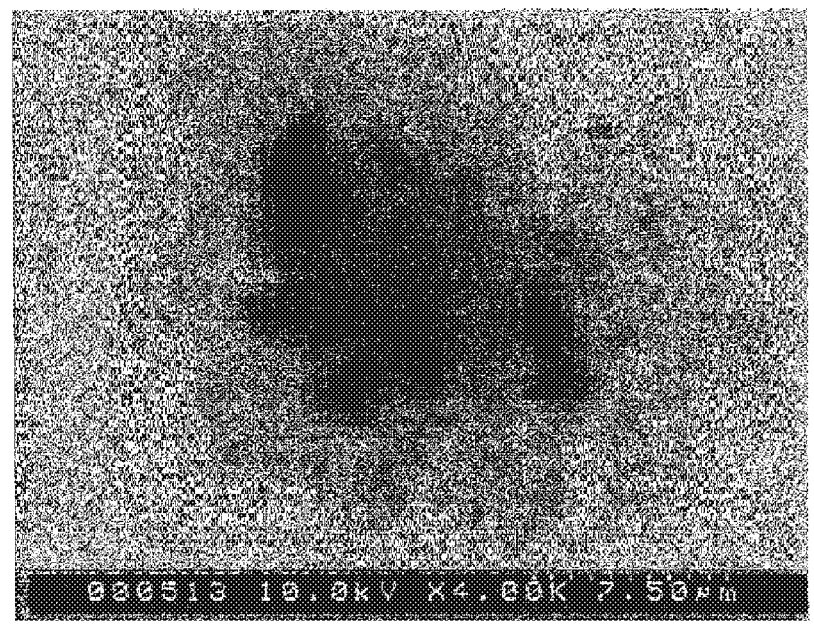

FIGS. 19A to 19B show a transmission image (FIG. 19A) acquired by the principle of detection in this example and a surface image (FIG. 19B) acquired with a reflected electron detector. Much information that could not be obtained from the surface image could be recognized from the transmission image. The shooting conditions for the examples in FIGS. 19A to 19B are as follows: applied voltage is 5 kV and magnification is approximately 4000 times.

The internal structure of a cell is different depending on the type of the cell and includes various organelles, such as mitochondria, Golgi body, and endoplasmic reticulum, with a nucleus in the center. The amount of a transmitted charged particle beam depends on the position or region of an internal structure. For this reason, the position or region of an internal structure can be visualized by taking the following procedure: the tilt angle of the sample 9 is varied before applying a charged particle beam 35; transmitted charged particles are detected; and transmitted charged particle beam images acquired from a plurality of directions are three-dimensionally reconstructed.

A description will be given to a principle of visualization of the internal structure of a sample 9 by a charged particle beam with reference to FIGS. 3A to 3C. The drawings illustrate relation between a sample 9 and a charged particle beam 35 observed when the beam is applied. The sample 9 has an internal substance 100, an internal substance 102, and an internal substance 103 relatively high in density in a substance 101 relatively low in density. It is assumed that the internal substance 103 is smaller in size and lower in density than the internal substances 100, 102. When it is assumed that the sample 9 is a cell sample, for example, the substance 101 corresponds to the interior of the cell and the internal substances 100, 102, 103 contained in the substance 101 correspond to cell organelles, such as a cell nucleus.

The charged particle beam 35 applied to the sample 9 is scanned in a plane perpendicular to an optical axis 106 that is the axis of the charged particle optical lens tube 3. As a result, signals converted into optical signals by the light emitting element 23 are displayed as a microscope image on the monitor. In FIG. 3A, more charged particle beams 35 are back-scattered at the internal substances 100, 102 than at the low-density internal substance 103. For this reason, the image obtained below the sample 9 when the sample 9 is scanned with a charged particle beam is as shown as a projection image 150. (The image obtained below the sample is also referred to as a detection image or a transmitted charged particle image.) For this reason, as illustrated in FIG. 3A, the distance C between the internal substance 100 and the internal substance 102 in the projection image 150 is different from an actual distance. As for many charged particle beams applied to the vicinity of the internal substance 103, the number of back-scattered charged particles is smaller than those for the internal substances 100, 102. As the result of detection after transmission, when detection signals are weaker than for the substance 101, the signals are not detected and not reflected in the projection image 150.

Figure 3A:
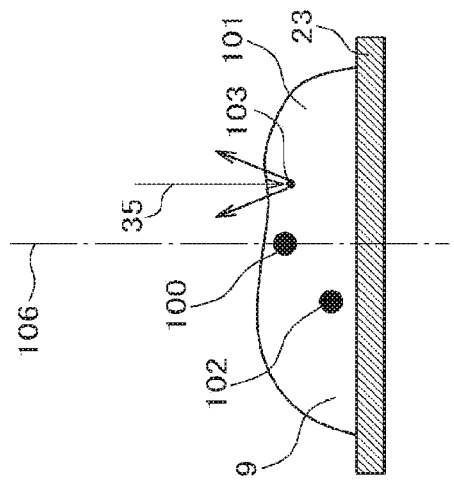
FIG. 3A is an explanation drawing of an observation method and a 3D observation method for a biological sample.
Figure 3A:
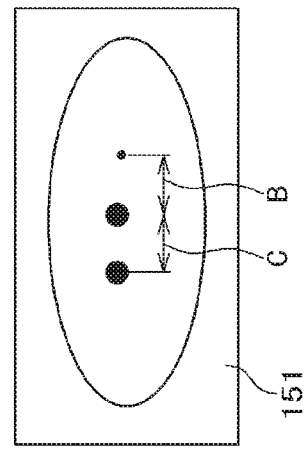
Figure 3B:
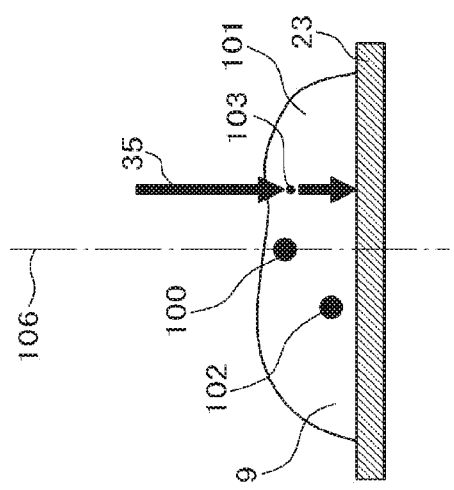
FIG. 3B is an explanation drawing of an observation method and a 3D observation method for a biological sample.
Figure 3B:
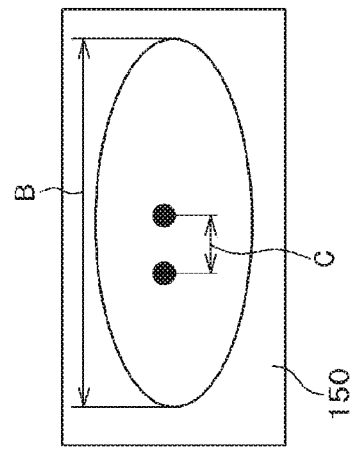
Figure 3C:
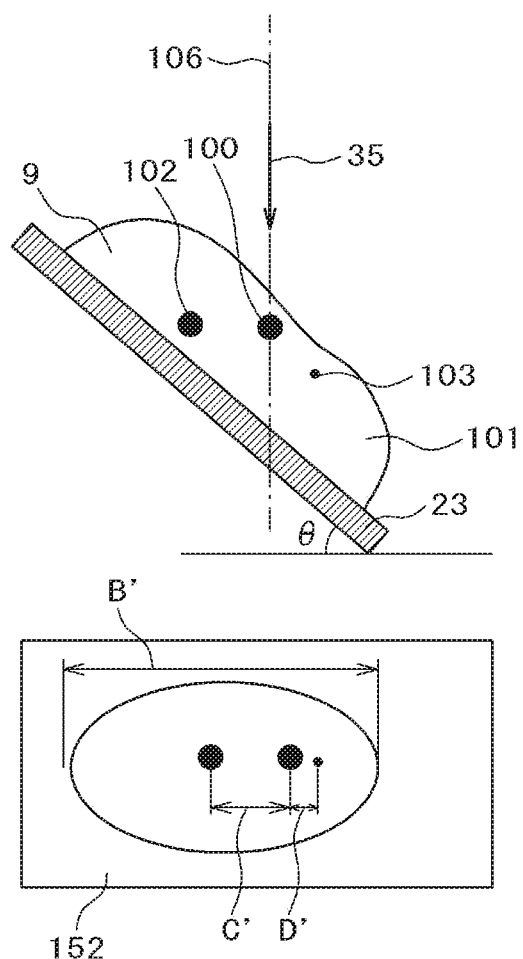
FIG. 3C is an explanation drawing of an observation method and a 3D observation method for a biological sample.

FIG. 3B is an explanation drawing illustrating a case where the energy E of the charged particle beam 35 is made smaller than in the case in FIG. 3A and illustrates a projection image 151 obtained in this case. In FIG. 3A and FIG. 3B, the magnitude of energy E is explicitly indicated by the thickness of arrows. When energy E is small, the number of charged particles back-scattered at the internal substance 103 is increased. As a result, in addition to the structures of the internal substances 100, 102, the information of the internal structure 103 is reflected in the projection image (or detection image or transmitted charged particle image) 151. This results from a property that a charged particle beam with smaller energy is more prone to be scattered at a substance.

The three-dimensional positional relation between the internal substance 100, internal substance 102, and internal substance 103 is unknown from projection images obtained in FIG. 3A and FIG. 3B. To cope with this, a plurality of projection images is acquired while varying the incident direction of the charged particle beam 35 and its relative angle to the sample. Specifically, the sample 9 itself is tilted or the incident direction itself of the charged particle beam 35 is tilted relative to the optical axis 106. It is possible to grasp the three-dimensional positional relation between the internal structures based on a plurality of the projection images. FIG. 3C illustrates how a charged particle beam is obliquely applied to a sample 9 by tilting the sample support 23 by an angle of θ. When the projection image 151 and the projection image (or detection image) 152 are compared with each other, the distances between the internal substance 100, internal substance 102, and internal substance 103 vary (C' section and D' section in the drawing). Further, the size of the substance 101 also varies (B' section in the drawing). That is, the three-dimensional internal structures of the entire sample 9 and the interior thereof can be observed by comparing and observing the projection image 151 and the projection image 152 to obtain an amount of change.

Though not shown in the drawing, the beam diameter of the charged particle beam 35 and the detection signals of the detector 4, 39 depend on the amount of beam current. For this reason, the size of an internal structure to be observed can be controlled by varying the beam current. That is, to separate the information of the interior of a sample to be viewed and that not to be viewed from each other, the amount of beam current of a charged particle beam can be utilized as a control parameter.

In summary, in three-dimensional internal structure observation, a relative entrance angle θ obtained when a charged particle beam 35 is applied to a sample 9, the energy E of the charged particle beam, and a beam current amount I are important. These are nothing but vectors of the charged particle beam 35. In this specification, a set of the above-mentioned θ, E, and I will be collectively referred to as vector parameters. That is, the vector parameters are parameters that determine the correlation between the primary charged particle beam 35 and the sample 9. Therefore, the internal structure of a sample 9 on the sample support can be observed based on a plurality of transmitted charged particle images acquired with vector parameters varied by controlling the vector parameters (θ, E, I). The details of an internal structure can be three-dimensionally grasped by observing these images systematically arranged or consecutively displaying the images. By measuring the size, including distance and area, of each internal structure and comparing several images, the three-dimensional internal structure can also be quantified. "varying a vector parameter" cited above means that at least one of the relative angle θ between the primary charged particle beam 35 and the sample 9, the incident energy E of the primary charged particle beam, and the beam current amount I of the charged particle beam is varied.

There are cases where it is desired to quickly acquire internal information in real time. Examples of such cases include cases where a sample 9 is automatically moved and visualized by computer 14 tomography (CT) and the like as described later. In such a case, the time of placement in a charged particle beam apparatus is limited. In this case, a set of entrance angle θ, energy E, and beam current amount I may be varied in real time. This makes it possible to quickly acquire information of the interior of a sample to be visualized.

EXAMPLE 2

A description will be given to an example of a configuration in which a condensing convex lens 51 is used as the light gathering means 50. This example will be described as a second example of the present invention with reference to FIGS. 6A to 6B. Though not shown in the drawings, the emission wavelength of light gathered at the light emitting element 23 in this example is in a specific or any wavelength range of visible light, ultraviolet light, or infrared light.

When the light gathering means 50 is not provided, as much light as possible can be brought to a photodetector 4 by bringing the light emitting element 23 and the photodetector 4 close to each other to the limit. In this case, however, to widen an observation field, it is necessary to enlarge the detection surface 5 of the photodetector 4. For this reason, when a photodiode having a large detection surface 5 is used as the photodetector 4, a problem arises. Due to increase in capacitance, a response time required for detection is increased and this increases a time required for acquiring and reconstructing an image. As a result, it becomes difficult to perform astigmatism adjustment and focusing in a particle beam apparatus. When a photomultiplier is used instead of a photodiode as the photodetector 4, the overall size of the photodetector 4 is increased. This poses problems including an increased manufacturing cost resulting from increase in sample chamber size, degradation in the degree of freedom in photodetector 4 installation, and the like. To avoid these problems, a photodetector 4 having a smaller detection surface 5 is preferable. With a response frequency of several hundreds of kHz or above, an image with an optimal resolution can be obtained by forming the image with relatively slow scanning and visually checking it in focusing and astigmatism correction. With a higher speed of response, for example, several hundreds of kHz, these operations can be performed with relatively fast scanning and a higher effect is obtained. With a band of as faster a speed as 1 MHz or above, typically 30 frames or more per second, observation can be performed with scanning at a television rate and this is advantageous in observing a sample prone to charging.

Figure 6A:
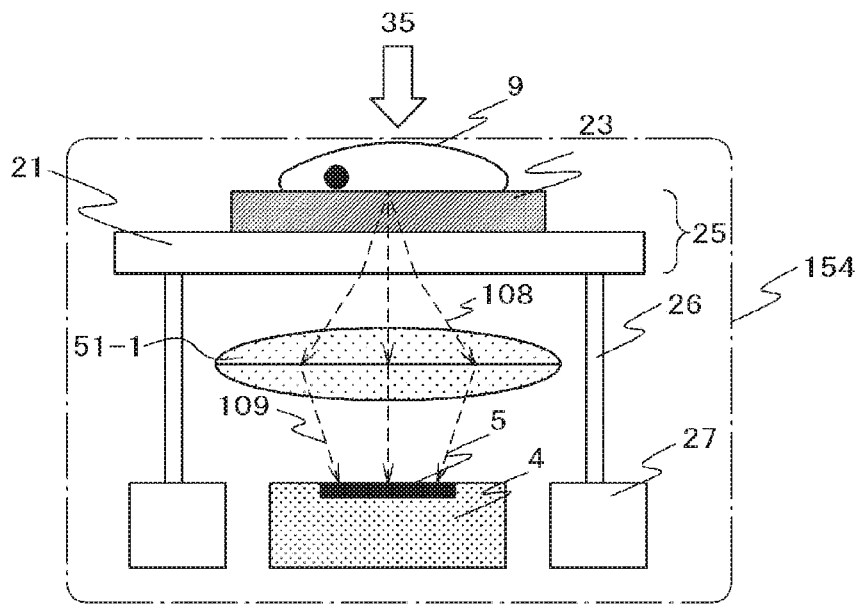
FIGS. 6A to 6B are block diagrams of a light gathering method using a light gathering lens in Example 2.
Figure 6B:
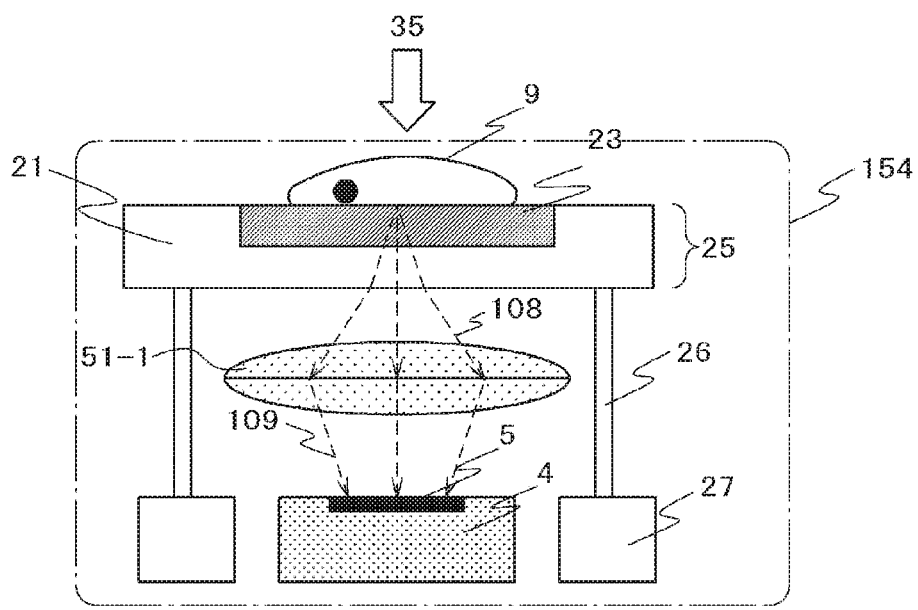

FIG. 6A illustrates an example of a structure in which a condensing lens 51-1 for gathering light 108 released from the light emitting element 23 is placed between the light emitting element 23 and the photodetector 4. It is desirable that the member 21 supporting the sample support 25 in the drawing should be made of a conductive and non-magnetic material, for example, stainless steel or the like. The condensing lens 51-1 functions to efficiently gather light 108 emitted from the light emitting element 23 to the detection surface 5. Though not shown in the drawing, the spot diameter of light gathered at the detection surface 5 of the photodetector 4 can be adjusted by optimizing the focal length of the condensing lens. This enables high-sensitivity detection even with a photodetector 4 having a smaller detection surface 5, typically, a PIN-photodiode capable of high-speed processing, a small-sized photomultiplier, or the like. FIG. 6B illustrates an example of a structure in which a recess for the light emitting element 23 is formed in the sample support and the light emitting element 23 is placed in the recess. Fitting the light emitting element 23 in the recess reduces positional displacement thereof caused by impact produced when the sample stage is moved.

Anything can be used for the material of the condensing lens as long as that is capable of gathering light. When the material of the condensing lens is a nonconductive material, such as glass and plastic, charge-up occurs when a charged particle beam is applied. To cope with this, the condensing lens can be coated with a transparent conductive film through which light can pass.

Figure 7:
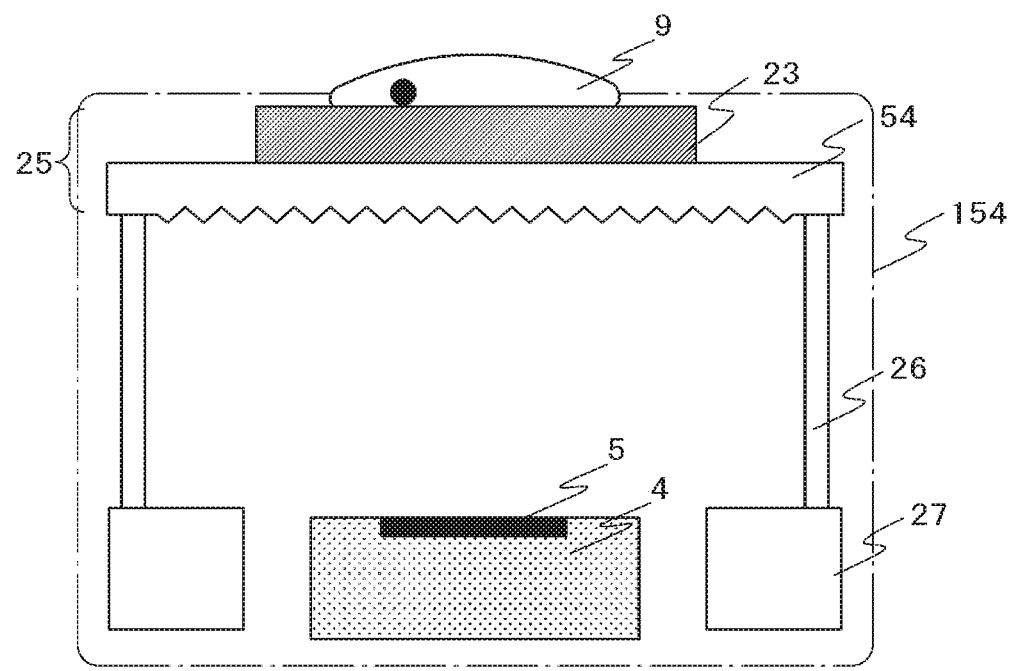
FIG. 7 is a block diagram of a light gathering method using a side lens in Example 2.

As illustrated in FIG. 7, a configuration in which a supporting member is used as the condensing lens in FIG. 6A and FIG. 6B is also acceptable. The example shown in FIG. 7 indicates a case where the supporting member is formed of a Fresnel lens 54.

The members embraced in the motion space 154 in FIGS. 6A to 6B and FIG. 7, specifically, the light emitting element 23, sample support unit 24, light gathering means 50, and photodetector 4 are integrated with a sample stage 8. Therefore, these members are so structured as to follow the movement of the sample stage 8. For this reason, there is not change in an optical path between the light emitting element 23 and the photodetector 4 and thus it can be said that light gathering efficiency does not vary so much.

Figure 8:
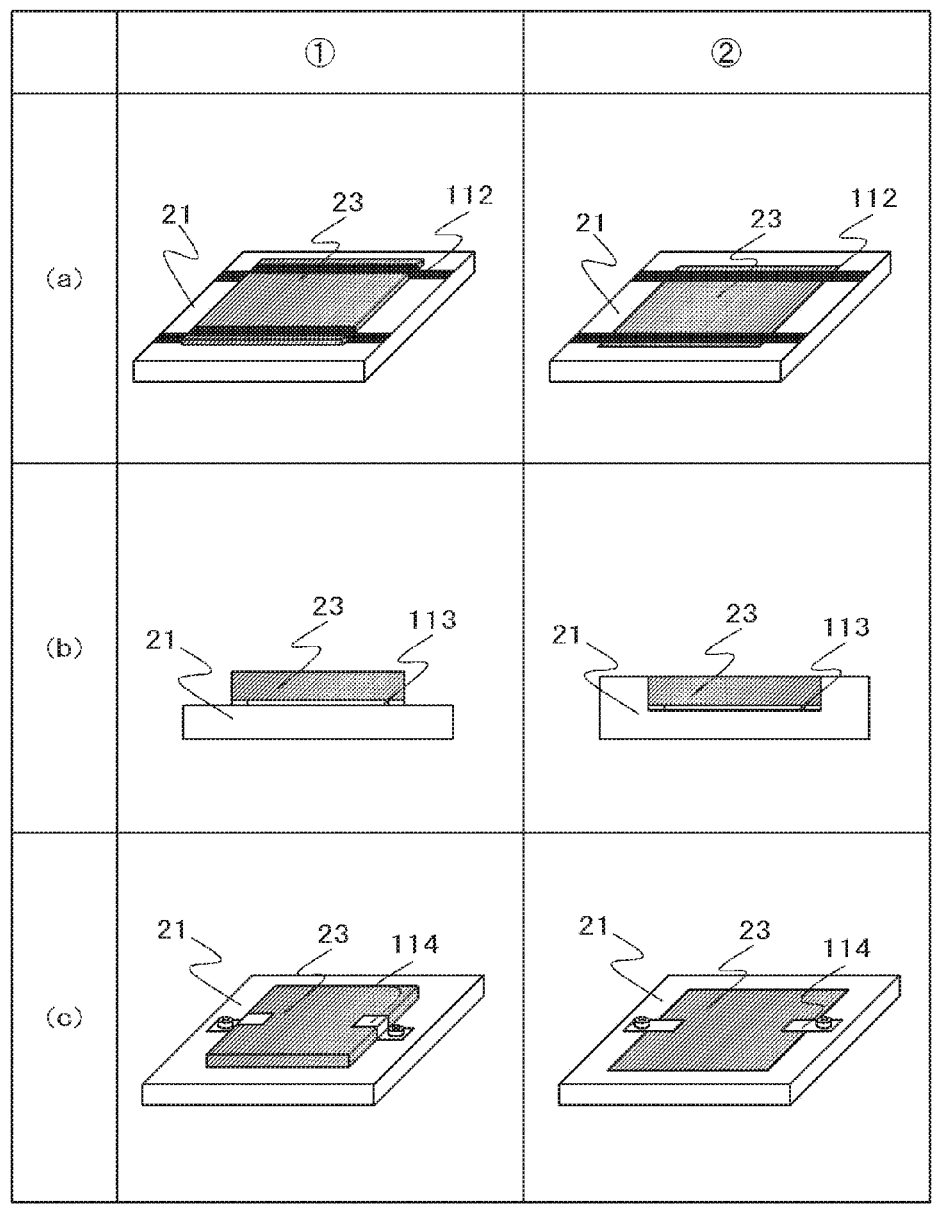
FIG. 8 is a detail drawing of a method for securing a light emitting element on a sample support unit.

FIG. 8 illustrates examples of methods for securing the light emitting element 23 on the supporting member 21. These methods are also applicable to a sample support unit and a sample support stage. (a) of FIG. 8 illustrates an example in which a conductive tape is used to secure the light emitting element 23 on the supporting member 21. In this case, it is advisable to fasten both ends of the light emitting element 23 to prevent a light emission path from being obstructed as much as possible. A charge-up preventive measure is provided for the sample support by using a conductive tape 112 for a charged particle beam microscope and grounding the tape. (b) of FIG. 8 illustrates an example in which a double-faced tape is used to secure the light emitting element 23 on the supporting member 21. This brings about an advantage that even when a sample convers the entire surface of the light emitting element 23, the sample can be secured without damaging the sample. In the example in (b) of FIG. 8, soling can be caused by bringing the double-faced tape 113 into contact with the light emitting element 23. As a method for avoiding this, (c) of FIG. 8 illustrates an example of a method for mechanically securing the light emitting element 23 and the supporting member 21 with a member of metal or the like. In case of a configuration in which a sample is held down from above, the size of the light emitting element 23 is limited by the configuration of the sample support functioning as a supporting substrate; therefore, it is necessary to design and fabricate a structure dedicated to the sample support unit. However, such a structure can be repeatedly used and this is convenient for observing applications in which the light emitting element 23 is replaced more than once. Though not shown in the drawings, the members secured in (a), (b) and (c) of FIG. 8 may be the light emitting element 23 and the sample support unit or stage.

Though a securing member may be one, such as adhesive, having an adhering effect, it is preferable to use one that does not produce gas when it is carried into a vacuum apparatus.

Figure 9A:
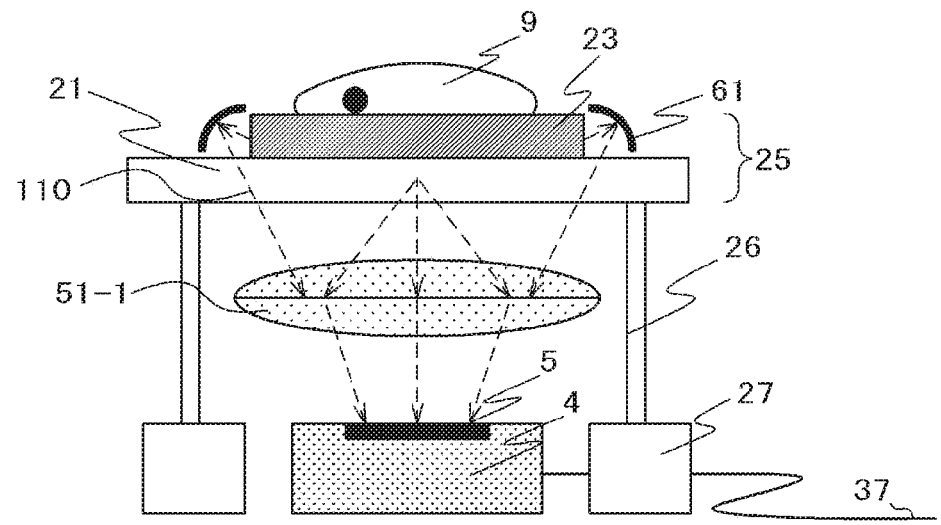
FIG. 9A is a block diagram of a sample support unit provided with a means for gathering emitted light from a side of a light emitting element in Example 2.
Figure 9B:
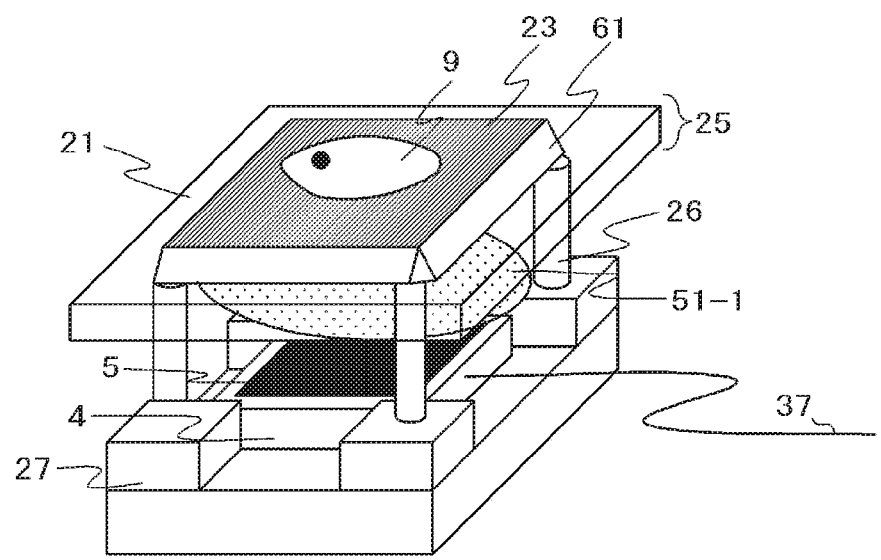
FIG. 9B is a block diagram of a sample support unit provided with a means for gathering emitted light from a side of a light emitting element in Example 2.
Figure 9C:
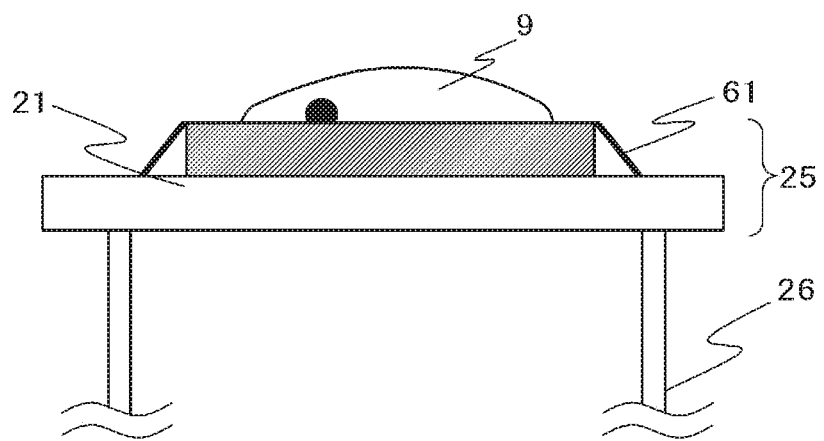
FIG. 9C is a block diagram of a sample support unit provided with a means for gathering emitted light from a side of a light emitting element in Example 2.

FIGS. 9A to 9C illustrate an example of a structure in which of light emitted in a rectangular plate-like light emitting element 23, light released from a side of the light emitting element 23 is gathered. FIG. 9A is a sectional view and FIG. 9B is a bird's-eye view. In a light emitting element used in this example, faces from which light is released to outside the light emitting element 23 are: a face (upper face) on which a sample is placed; an underside (lower face) parallel to the face on which a sample is placed; and four side faces. Light is uniformly radiated in all the directions. However, since the light emitting element is large in refraction index, part of the light is totally reflected at the lower face and part thereof is released from each side face to outside the light emitting element. At this time, the light quantity released from each side face is substantially identical with that from the lower face. Therefore, when in addition to light from the lower face, light released from the side faces is detected, it is expected that the amount of detected light is approximately five times that obtained when only light at the lower face is detected. As a means for gathering light 110 from the side faces, a side mirror 61 is disposed at each side face of the light emitting element 23. Light reflected at a side mirror 61 passes through the supporting member 21 and is gathered by the light gathering means 50 and detected at the detection surface 5 of the photodetector 4. Anything, including aluminum (Al) and gold (Au), can be used as the material of the side mirrors 61 as long as that reflects light. At this time, it is desirable that the supporting member 21 should be a member, for example, quartz, glass, plastic, and the like, that is capable of letting light through. When the supporting member 21 is nonconductive, charge-up occurs when a charged particle beam is applied; therefore, it is desirable to form on the supporting member 21 a transparent conductive film that does not obstruct the passage of light. The side mirrors 61 are structured such that the side mirrors are integrated with the supporting member 21 or moved together with the supporting member 21 when the supporting member is moved. FIG. 9C illustrates a structure in which a sloped mirror, not elliptic, having a flat surface is used as the side mirror 61. Though light gathering efficiency is degraded as compared with elliptical mirrors, the sloped mirrors are easy to fabricate and thus inexpensive.

The structure in which the side mirrors illustrated in FIGS. 9A to 9C are installed and light released from the sides of the light emitting element 23 to outside the light emitting element is guided to a detector is also applicable to the structures in FIGS. 6A to 6B and FIG. 7.

Figure 10A:
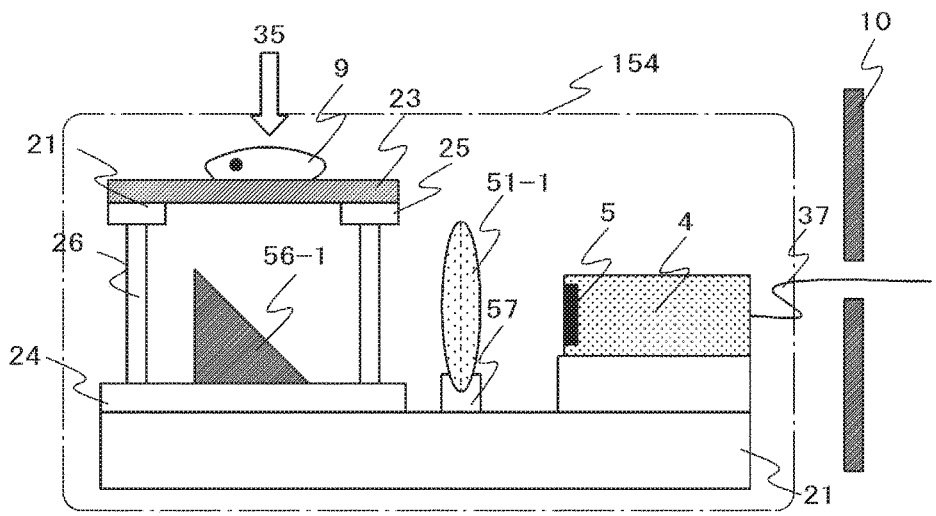
FIG. 10A is a block diagram of a sample support unit provided with a mirror and a lens related to emitted light from a light emitting element in Example 2.
Figure 10B:
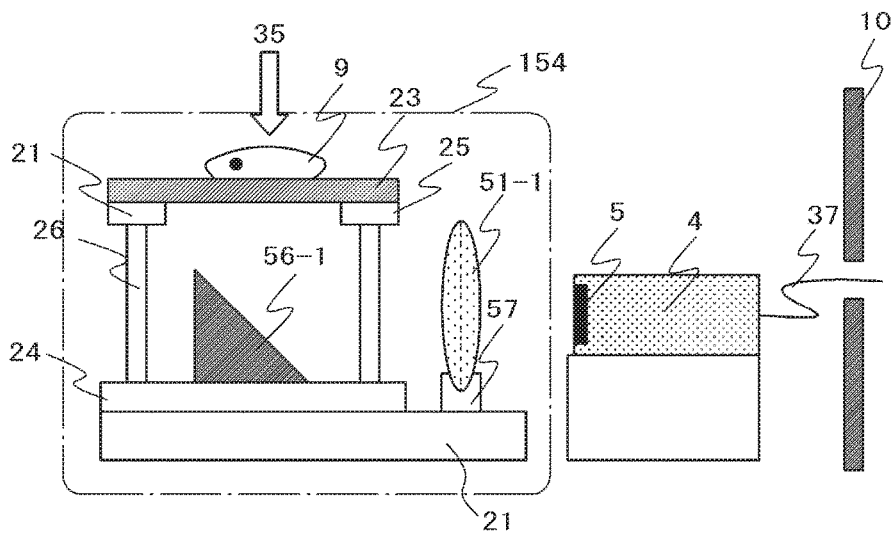
FIG. 10B is a block diagram of a sample support unit provided with a mirror and a lens related to emitted light from a light emitting element in Example 2.

FIGS. 10A to 10D illustrate examples of a structure in which a light gathering mirror 56-1 and a condensing lens 51-1 are combined with each other. FIG. 10A illustrates a structure in which all the members depicted inside the broken line in the drawing are installed together with a sample stage 8. Even when the sample stage is moved, positional fluctuation does not occur in the path from the light emitting element 23 to the condensing lens 51-1 to the photodetector 4. Therefore, this structure is characterized in that light gathering efficiency does not vary so much. In FIG. 10B, the light emitting element 23, the supporting member 21, the light gathering mirror 56-1, the condensing lens 51-1, and a lens support 57 depicted inside the broken line are mechanically secured on the sample stage 8. For this reason, these members follow the movement of the sample stage but the photodetector 4 does not follow the movement of the sample stage because the photodetector is not secured on the sample stage. Though not shown in the drawing, for the purpose of further enhancement of light gathering efficiency, a plurality of condensing lenses may be installed in an overlapped manner between the condensing lens 51-1 and the photodetector 4.

Figure 10C:
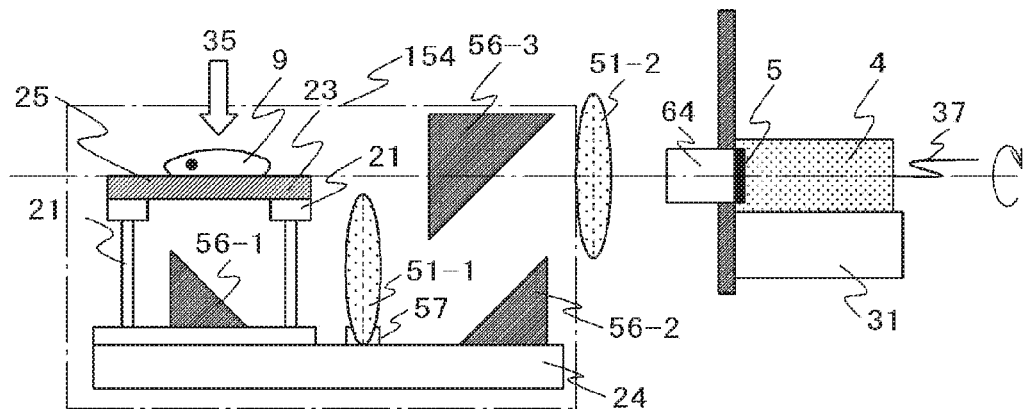
FIG. 10C is a block diagram of a sample support unit provided with a mirror and a lens related to emitted light from a light emitting element in Example 2.

FIG. 10C illustrates an example of a case where the photodetector 4 is set on the atmosphere side. Light generated at the light emitting element 23 is reflected toward the condensing lens 51-1 at the mirror 56-1. Light gathered at the condensing lens 51-1 is reflected toward the condensing lens 51-2 again at the mirror 56-2 and the mirror 56-3. Light gathered at the condensing lens 51-2 enters a light transfer path 64 and detected by the photodetector 4 located on the atmosphere side. The members joined to the sample stage 8 in the structure in this example are members in the area encircled with the broken line in the drawing. Examples of such members are the supporting member 21, light gathering mirrors 56-1, 56-2, and condensing lens 51-1. When the light gathering mirror 56-3 and the condensing lens 51-2 are formed of a material having as large a size as possible, light gathering efficiency does not vary so much in conjunction with the movement of the sample stage. What is important here is as follows: when a transmission image of a tilted sample is acquired, variation in detection signal from different tilt angle to tilt angle should be reduced as much as possible. For this purpose, the tilting rotation axis indicated by alternate long and short dashed lines in FIG. 10C is a straight line running through the sample 9 and the vacuum-side end face of the light transfer path 64. By configuring the light gathering means 50 as mentioned above, it is possible to efficiently cause light from the light emitting element 23 to enter a photoconduction path. As a result, when a transmitted charged particle beam image is acquired for stereoscopic observation or three-dimensional observation of the internal information of a sample, light collecting efficiency is made constant regardless of a sample tilt angle and necessity for brightness correction is obviated. Even when a sample is largely tilted, a transmitted charged particle beam image can be acquired. In the case of the configuration in FIG. 10C, the following operation can be performed in order to perform stereoscopic observation or three-dimensional observation of the internal information of a sample by a similar means with an observation field varied: the entire sample stage is translated in the direction of the tilting rotation axis indicated by alternate long and short dashed lines. At this time, the same effect is obtained as long as the optical path is located anywhere in an end face of the light transfer path 64; therefore, it is effective to enlarge the size of the end face of the light transfer path 64 to the extent that the apparatus is usable.

Figure 10D:
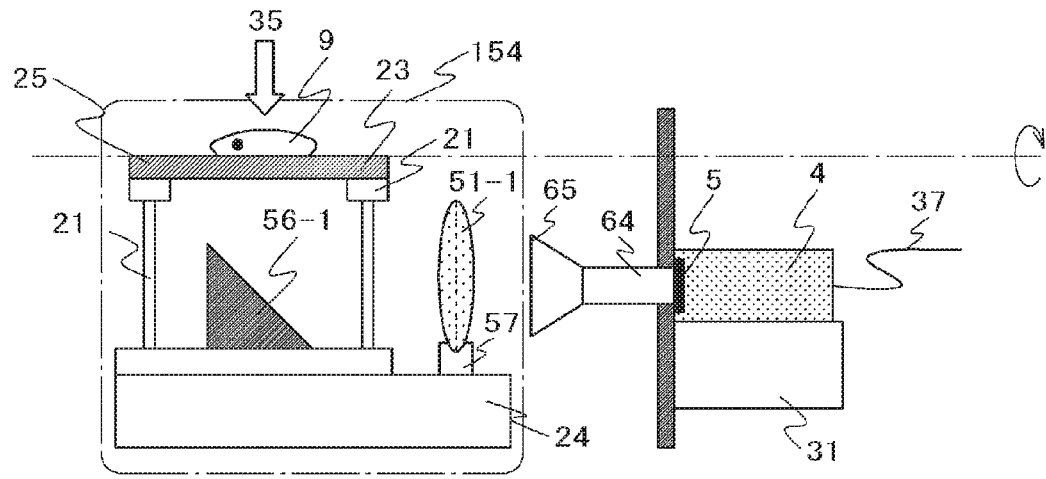
FIG. 10D is a block diagram of a sample support unit provided with a mirror and a lens related to emitted light from a light emitting element in Example 2.

FIG. 10D illustrates an example in which a photodetector 4 is placed on the atmosphere side. A charged particle beam 35 applied to a sample 9 passes through the sample 9 and causes a light emitting element 23 to emit light. This light passes through a light gathering mirror 56-1 and a condensing lens 51-1 and is then gathered at a reflecting cylindrical mirror 65. The light thereafter moves in a light transfer path 64 and is detected at the photodetector 4 installed on the atmosphere side. The members joined to the sample stage in the structure in this example are members in the area 154 encircled with a broken line in the drawing. In this example, an advantage is brought about by increasing the area of a light take-in port. Even when a sample 9 is moved in the direction perpendicular to the optical axis to vary the tilt angle of the sample 9 or shift an observation field, the amount of light taken in does not vary so much. To form this light take-in port, a lens, a mirror, a light guide, or the like is used. Use of a thing obtained by bundling a large number of slender hollow capillaries toward the direction of optical transmission is further effective.

The structure in FIGS. 9A to 9C in which light released from the sides of the light emitting element 23 to outside the light emitting element is guided to the detector is also applicable to the structure in FIGS. 10A to 10D.

Figure 12A:
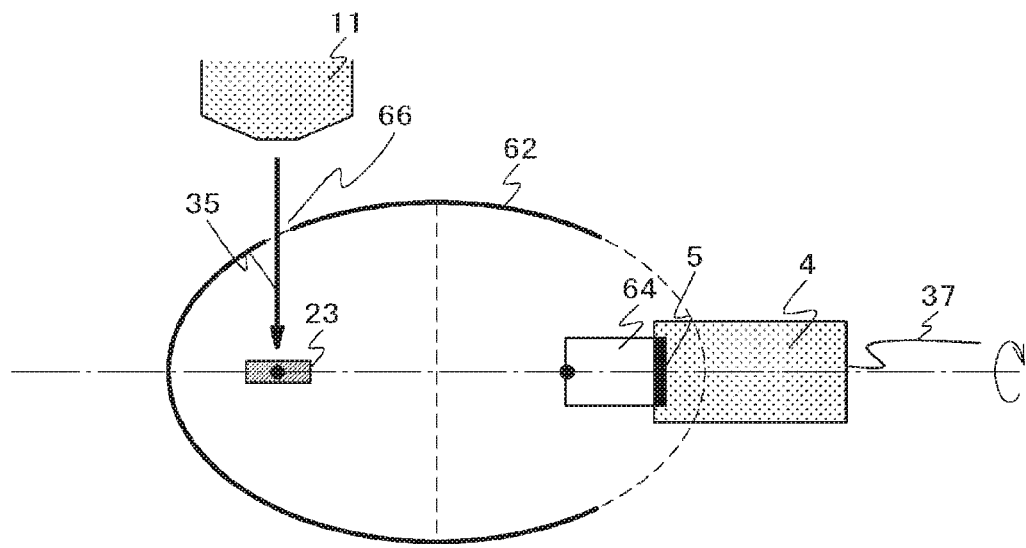
FIGS. 12A to 12B are block diagrams of a sample support unit provided with a means for gathering emitted light from a light emitting element with an elliptical mirror in Example 2.

FIG. 12A illustrates an example of an attempt to efficiently gather emitted light from the light emitting element 23. When the inner face of a rotational ellipsoid is formed as a mirror surface as illustrated in FIG. 11, light exiting from one focal point A has the property of being reflected at the surface of the rotational ellipsoid and gathering at another focal point A'. A procedure is taken utilizing this property. A point of light emission from the light emitting element 23 in FIG. 12A, that is, the irradiation position of a charged particle beam 35 generated from the charged particle source 11 is aligned with the focal point A; and the entry portion of the light transfer path 64 is aligned with the other focal point A'. A passage port 66 for the charged particle beam 35 is provided in a position where the rotational ellipsoid and the optical axis of the charged particle beam intersect with each other. Hereafter, a rotational ellipsoid whose inner face is a mirror surface as mentioned above will be referred to as elliptical mirror 62. Light gathering at the entry portion of the light transfer path 64 passes through the light transfer path 64, is detected at the photodetector 4, and is thereafter outputted to the outside through a signal wire 37. Since this configuration can be implemented with an elliptical mirror, a light transfer path, and a photodetector, an advantage that light can be gathered with a less number of parts is brought about.

Figure 12B:
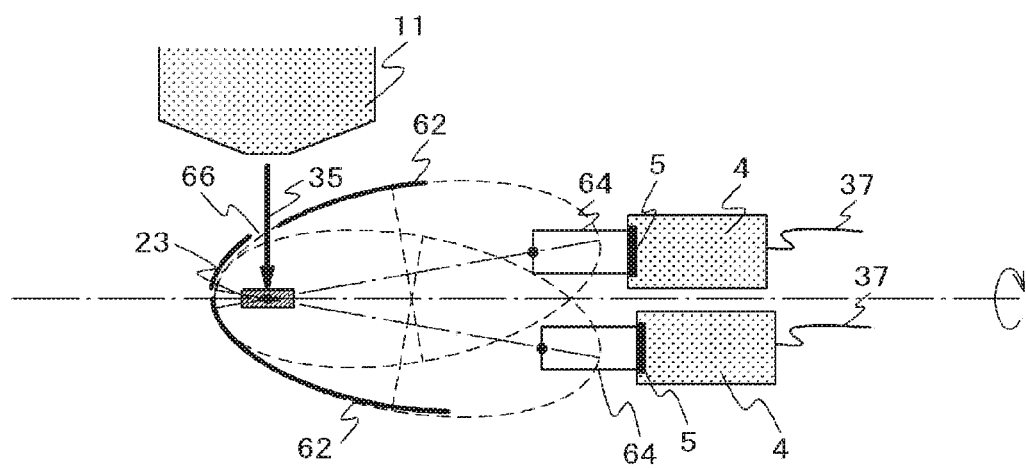

FIG. 12B illustrates a configuration of a sample support using two elliptical mirrors and two photodetectors 4. The light emitting element 23 is disposed at a point (A) where longitudinal central axes of two ellipses intersect with each other such that a focal point is located at A. Emitted light from the upper face of the light emitting element 23 is reflected at the elliptical mirror 62 installed above. The light is then gathered at the entry portion of the light transfer path 64 that is the other focal point (A') and detected at the photodetector 4. In common with the upper face, emitted light from the lower face of the light emitting element 23 is detected with the elliptical mirror 62 installed below, the light transfer path, and the photodetector 4. Light from a side of the light emitting element 23 is detected with either of the vertically installed photodetectors 4. Since the upper and lower elliptical mirrors are separate structures, an advantage is brought about. When it is desired to observe a secondary electron image with this structure, it only has to be configured such that the upper elliptical mirror and the upper photodetector 4 can be moved from above the sample. Though not shown in the drawing, the light emitting element 23 is joined to the sample stage while the light gathering mirrors 62, light transfer paths 64, and photodetectors 4 are fixed members.

Figure 13A:
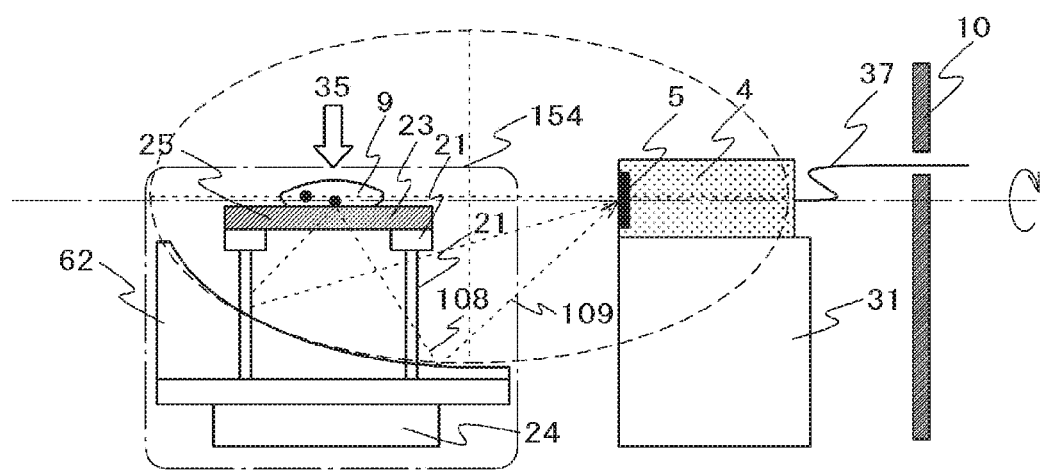
FIG. 13A is a block diagram of a sample support unit provided with a means for gathering emitted light from a light emitting element with an elliptical mirror in Example 2.
Figure 13B:
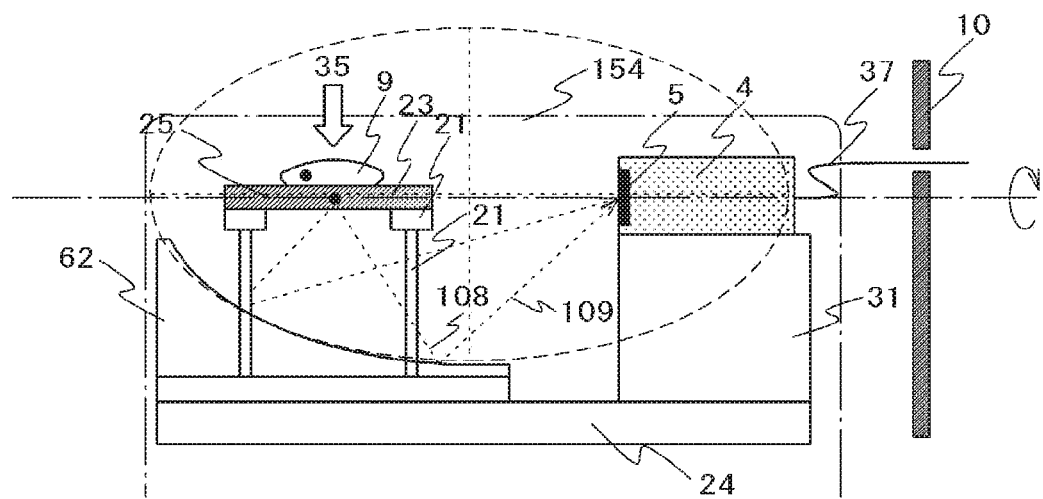
FIG. 13B is a block diagram of a sample support unit provided with a means for gathering emitted light from a light emitting element with an elliptical mirror in Example 2.
Figure 13C:
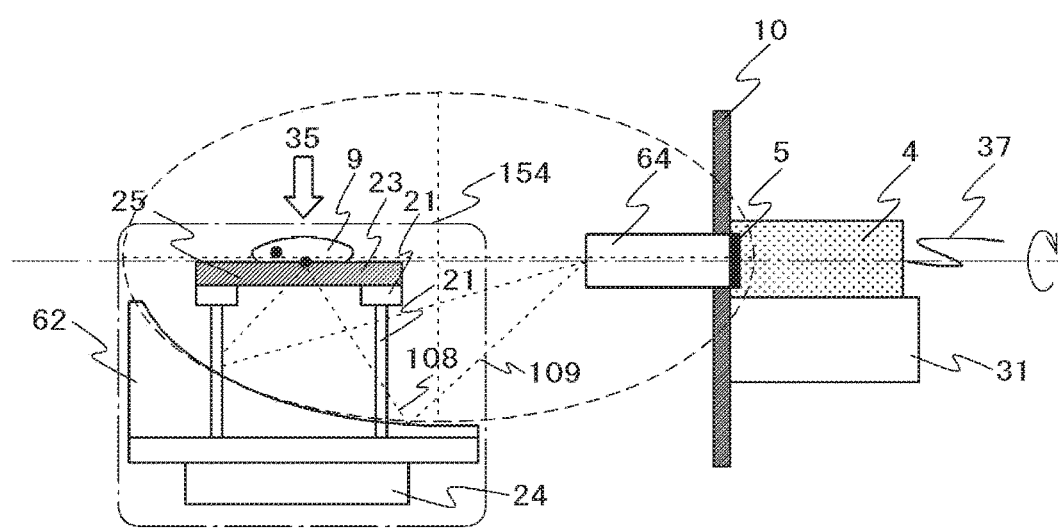
FIG. 13C is a block diagram of a sample support unit provided with a means for gathering emitted light from a light emitting element with an elliptical mirror in Example 2.

FIGS. 13A to 13C illustrate examples of a light gathering structure adopted when an elliptical mirror is used. An advantage of this configuration is as follows: since the mirror is a member made of a conductive material or coated with a conductive material, there is no danger of charge-up. FIG. 13A illustrates a structure having a function of gathering light radiated using an elliptical mirror at the detection surface 5 of a photodetector 4. In FIG. 13A, a sample stage is tilted around an axis, indicated by alternate long and short dashed lines, running through a cell to be observed. Since at this time, the sample stage does not make the same movement as the photodetector 4 does, the optical path is caused to fluctuate by the movement of the stage. To prevent the light gathering efficiency of the detector 4 from being degraded by this fluctuation, one focal point of the elliptical mirror 62 is set at the sample and the other focal point is set in proximity to the detection surface 4. As mentioned above, this facilitates stereoscopic observation, three-dimensional observation, and the like of a cell.

FIG. 13B illustrates an example of a structure in which the light emitting element 23, elliptical mirror 62 for light gathering, photodetector 4, and the like are joined to the sample stage with an identical member. Since the path between the light emitting element 23 and the photodetector 4 does not vary so much when the sample stage is moved, variation in light gathering efficiency can be reduced.

FIG. 13C is a structural drawing illustrating a case where a photodetector 4 is installed on the atmosphere side. In this configuration, light exiting from the light emitting element 23 is reflected at an elliptical mirror and gathered at a light transfer path 64; and then the light passes through the light transfer path 64 and detected at the photodetector 4 installed on the atmosphere side. This configuration is similarly characterized in that stereoscopic observation, three-dimensional observation, and the like of a cell are facilitated. The light transfer path 64 may be a solid substance capable of transferring light or may be located in air, vacuum, or the like. Examples of solid materials allowing the passage of emitted light in a wavelength range thereof are materials, such as quartz, glass, optical fiber, and plastic, transparent or translucent to light.

FIG. 13C illustrates an example of a configuration in which a detector is located in atmospheric space and a light emitting element 23, supporting member 21, light gathering mirror, and photodetector 4 are joined to a sample stage with an identical member. The configuration is characterized in that light gathering efficiency does not vary so much when the sample stage is tilted or moved.

As described in relation to this example, an effect is obtained by using a light gathering means to gather emitted light from a light emitting element to a detector. Light gathering efficiency is enhanced and transmission images can be more clearly observed. Even in three-dimensional observation performed with a sample tilted, it is possible to suppress degradation in light gathering efficiency caused by tilting of a sample support.

EXAMPLE 3

With respect to this example, a description will be given to an example of a configuration of a sample support unit for side entry type used mainly in an in-lens-type scanning electron microscope (SEM) or (S)TEM capable of high-resolution observation. As compared with the configurations in Example 2, the configurations in this example brings about various advantages. The configurations enable observation of a microstructure and are high in the degree of freedom of tilting of a sample stage, which makes it possible to easily perform tomography observation for observing the three-dimensional structure of a sample.

Figure 14A:
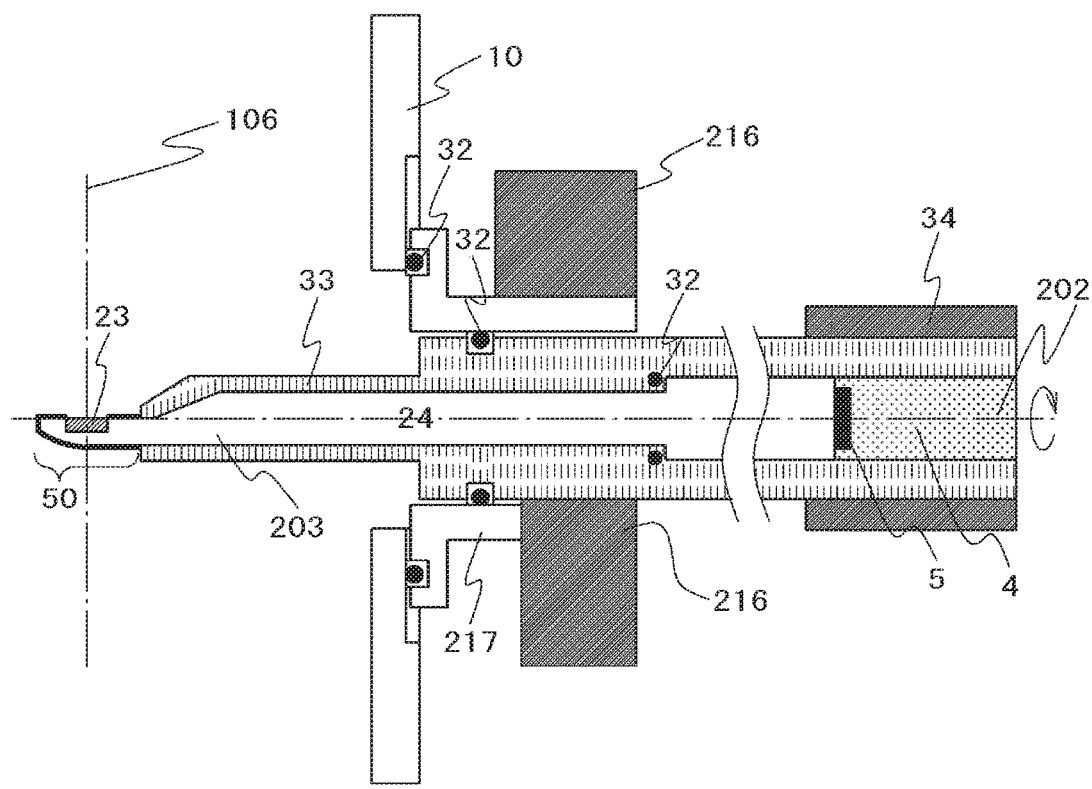
FIG. 14A is a block diagram of a charged particle microscope apparatus of a side entry type in Example 3.
Figure 14B:
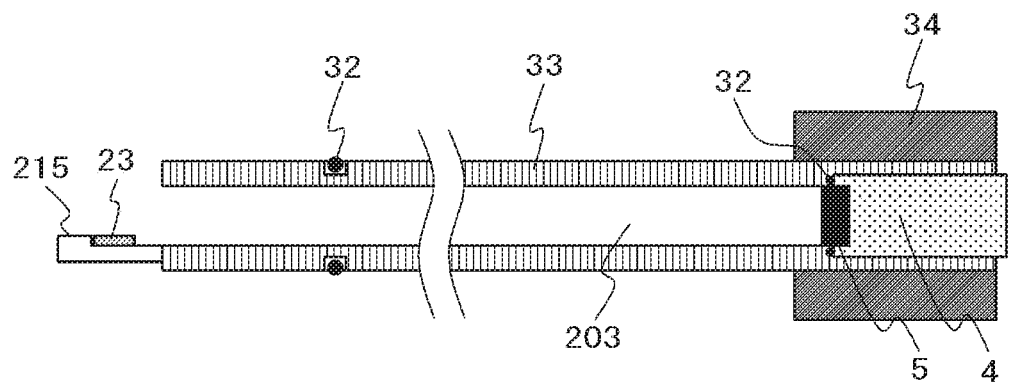
FIG. 14B is a block diagram of a charged particle microscope apparatus of a side entry type in Example 3.
Figure 14C:
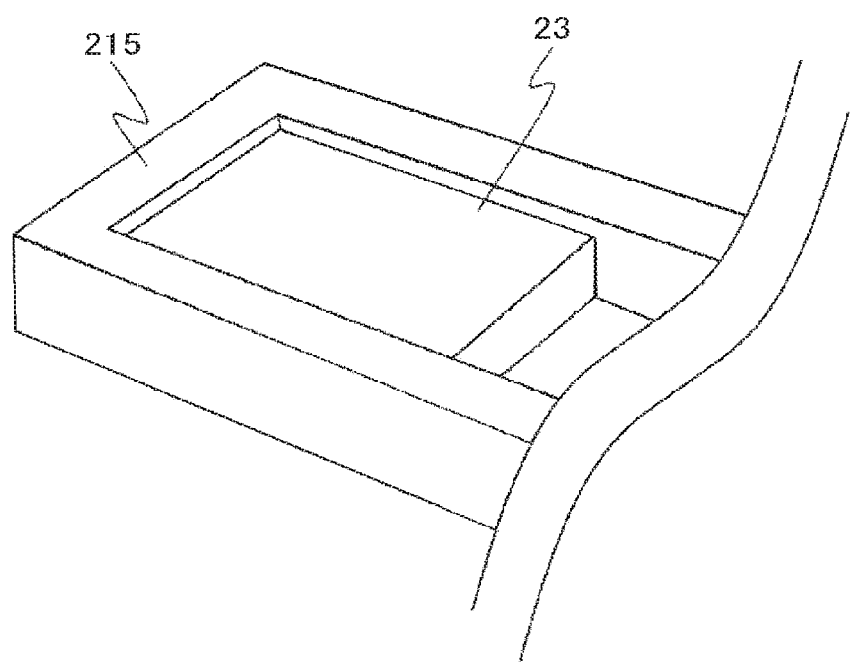
FIG. 14C is a block diagram of a charged particle microscope apparatus of a side entry type in Example 3.

FIG. 14A is an overall block diagram of a sample support unit in this example; FIG. 14B is a sectional view of a basic configuration thereof; and FIG. 14C is a perspective view of a tip of the sample support unit.

The sample support unit is constructed of: a light emitting member placement portion 215 which includes a sample holder and on which at least a light emitting element 23 can be placed; a rod-like support 33 provided with a path 203 for transferring light from the light emitting element 23 and constituting a main member of the sample support unit; a photodetector 4; and a handle 34. The photodetector 4 is connected with a control unit 16 and the like through wiring. The light transfer path 203 may be just a space or may be a light transferring substance, such as glass, quartz, plastic, or the like, capable of transferring light from the light emitting element 23. A member forming at least a part of the light transfer path will be referred to as light transferring member. The light transferring member is a light transferring substance such as a support 33, a light guide, an optical fiber, or the like, for example. In cases where a light gathering member such as a lens and/or a reflecting member such as a mirror is present at some midpoint in the light transfer path, these members are also included in the light transferring member. Either the photodetector 4 or the light transferring member is provided with an O ring 32 that is a vacuum sealing member capable of maintaining hermeticity between vacuum and outside air. In addition, the support 33 may be provided with an O ring 32 capable of vacuum hermetic sealing between the support and an enclosure 10 or the like. It is assumed that the light emitting element 23 is secured with a fixing member or the like, not shown, on the light emitting member placement portion 215 on which the light emitting element 23 can be placed. The sample support unit is provided with a drive mechanism, not shown in FIGS. 14A to 14E and the sample support unit is configured such that an observation position can be shifted as required and a tilt angle can be varied by the mechanism.

When the light emitting element 23 is irradiated with a charged particle beam in this configuration, light is generated within the light emitting element and the light is released from the surfaces of the light emitting element. The surfaces of the light emitting element include a face (upper face) on which a sample is placed and the other faces. As described with reference to FIGS. 9A to 9C, especially, when the light emitting element is in the shape of a rectangle plate, light is released to outside the light emitting element 23 from the following faces: a face (upper face) on which the sample is placed; a backside (lower face) parallel to the face on which the sample is placed; and side faces non-parallel to the face on which the sample is placed, that is, the four side faces. In the configuration in FIG. 14C, light is released from a side face of the light emitting element 23 on the photodetector side and the opposite face thereof to outside the light emitting element 23; and then light reflected at the contact faces with the light emitting member placement portion 215 is detected by the photodetector 4.

Figure 14D:
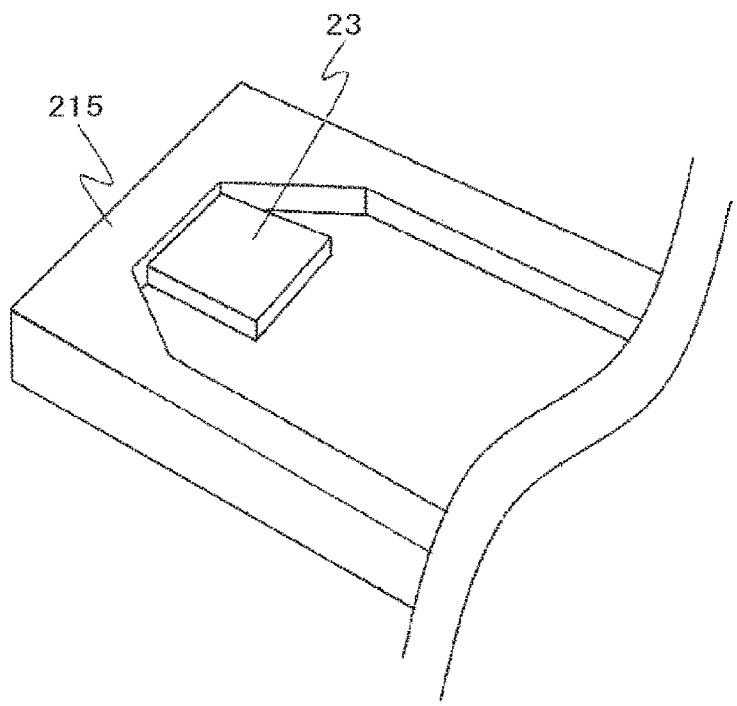
FIG. 14D is a block diagram of a charged particle microscope apparatus of a side entry type in Example 3.
Figure 14E:
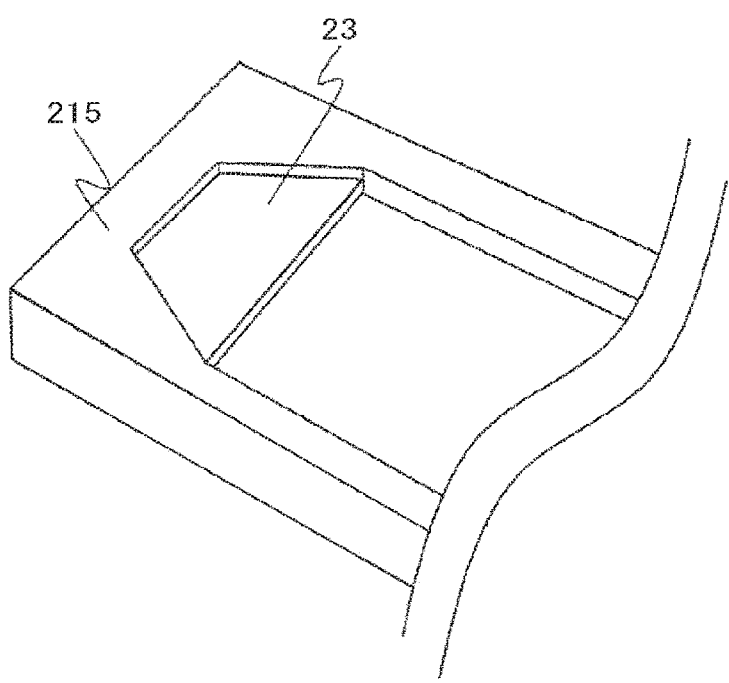
FIG. 14E is a block diagram of a charged particle microscope apparatus of a side entry type in Example 3.

The shape of the tip of the light emitting member placement portion 215 is not limited to the foregoing. As illustrated in FIG. 14D, the tip may be so configured as to guide reflected light to the photodetector 4 to detect light released from the side faces of the light emitting element 23 in the direction orthogonal to the rotation axis 202. Further, the shape of the light emitting member 23 is not limited to the foregoing. The configuration illustrated in FIG. 14E may be adopted. In this configuration, the light emitting element 23 is a trapezoidal plate and the side portions thereof are a mirror and reflected light is guided to the detector 4. The side faces of the light emitting element 23 may be curved.

As described with reference to FIGS. 9A to 9C, light released from the side faces of a rectangular plate-like light emitting element 23 to outside the light emitting element is released not only from the underside (lower face) parallel to the sample placement face. The light is released also from the side faces. For this reason, when light released from the lower face and the side faces to outside the light emitting element is detected, it is expected that the amount of detection signals is approximately five times that obtained when only light from the lower face is detected. By guiding light released from the side faces of the light emitting element 23 to outside the light emitting element to the detector, the strength of detected signals is increased. This makes it possible to acquire transmission images in this example with high accuracy and high efficiency. For this purpose, a light transferring member is provided. The light transferring member constitutes a light transfer path for transferring light launched also from a face of the light emitting member non-parallel to the face on which a sample is placed toward a detector. As described later, the light emitting member placement portion 215 may be provided with a reflector 50 for guiding light from the light emitting element 23 toward the photodetector 4. The reflector 50 includes a case where the light emitting member placement portion 215 is processed into a mirror and a case where the light emitting member placement portion 215 is formed of a metal member. In these cases, the light emitting member placement portion becomes a reflector.

The side entry-type sample support is a sample support for making it possible to insert a light emitting member with a sample placed thereon from the lateral direction of the enclosure 10 to a place where the optical axis 106 is located. Since the detector is provided in the direction of the handle 34, the light transfer path is laterally extended from under the sample placement area. This side entry-type sample support is configured such that during acquisition of a transmission image of a tilted sample, detection signals do not vary so much when the tilt angle is varied. In FIG. 14A, the tilting rotation axis 202 indicated by alternate long and short dashed lines runs through the sample and is aligned with the center of the detection surface 5 of the detector 4. Since the light emitting element 23, light gathering means 50, photodetector 4, and the like are mechanically joined, an advantage is brought about. When the sample stage is moved and tilted and similar observation is performed with the configuration in FIG. 14A, the optical path does not vary. For this reason, when a transmitted charged particle beam image is acquired for stereoscopic observation or three-dimensional observation of the internal information of a sample, an advantage is brought about. Light collecting efficiency is constant regardless of the sample tilt angle and it is unnecessary to correct the brightness between detection images acquired under different conditions. Even when a sample is largely tilted, a transmitted charged particle beam image can be acquired. In case where the observation apparatus is SEM, an objective lens is variously configured depending on how the lens magnetic field is distributed but the foregoing is applicable to any type of configuration. The side entry type-sample stage is mainly used in the configuration of an in-lens-type objective lens in which a sample is immersed in a lens magnetic field among existing apparatuses. When the foregoing is applied to this configuration, high-resolution observation can be performed. In any type of configuration, the sample support unit is provided with a mechanism portion 216 for shifting an observation field or changing a sample tilt angle.

With reference to FIG. 14A, a description will be given to a mechanism portion for moving the sample support unit. The mechanism portion 216 is capable of moving the sample support unit 24 inserted into the enclosure 10 or the supporting member 217. The mechanism portion is capable of driving the sample support unit 24 in the horizontal direction and the vertical direction in the drawing. In addition, a drive mechanism capable of rotating the sample support unit around the central axis thereof is provided. FIG. 14A illustrates an example in which the mechanism portion 216 is automatically moved through the control unit; but the mechanism portion may be manually moved by a user him/herself. In the case of this sample support unit, an advantage is brought about. Even when the sample support unit is rotated around the central axis thereof to tilt a sample, the positional relation between the light emitting element 23 and the photodetector 4 is unchanged. For this reason, as compared with the above-mentioned examples, this example is characterized in that the tilt of a sample can be easily observed.

A description of the common configurations described in relation to Example 1 will be omitted. Such configurations include: a control system for controlling each lens 200; a detection system for detecting detection signals; the vacuum pump 7 for evacuating the enclosure 10 and the charged particle optical lens tube 3; and the like. In common with Examples 1 and 2, the light emitting element 23 with a sample placed thereon is caused to emit light by application of a charged particle beam that passed through the sample; and released light is gathered at the light gathering means 50, guided to the detector 4 through the light transfer path 203, converted into electrical signals, and detected.

Figure 15A:
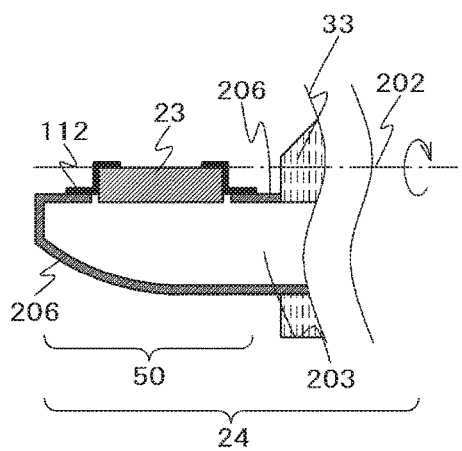
Figure 15B:
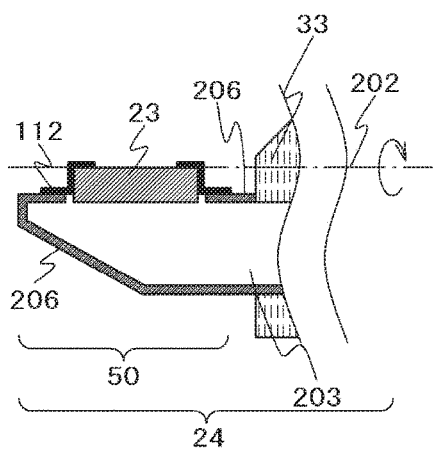
Figure 15B:
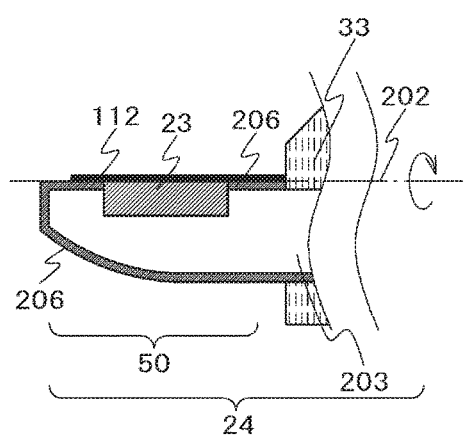
Figure 15B:
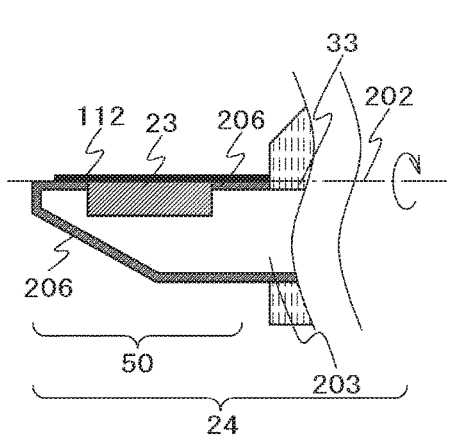
Figure 15B:
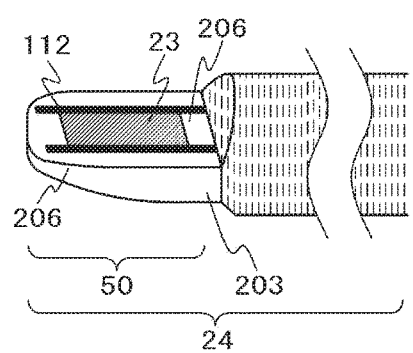
Figure 15B:
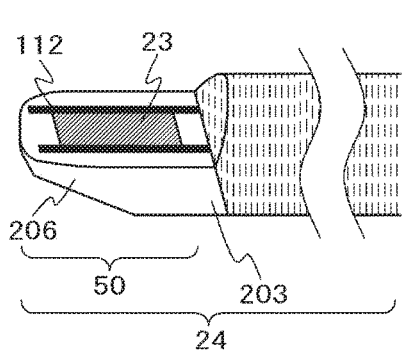

As illustrated in FIG. 15A and FIG. 15B, the light gathering means 50 includes: a part of the light transfer path 203 formed of a transparent medium; and an optical reflector, a reflector 206 of, for example, aluminum (Al) or the like in this case, covering the same. The shape of the light gathering means is curved, flat, or the like and acts to reflect light released from the light emitting element 23 to a direction in which the light does not go directly to the detector 4 to the detector side. The sample support unit 24 has various advantages. A possibility that light which is probably undetectable with the configuration in Example 1 or 2 can be detected through the light transfer path 203 is enhanced. Light gathering efficiency does not fluctuate so much when the sample support unit 24 is moved. The sample support unit 24 can be configured with a simple structure and a less number of members. In the description of this example, a case where the charged particle beam apparatus 36 is an electron microscope is taken as an example. Also in the cases of other charged particle beam apparatuses 36, the same effect is obtained.

FIGS. 15A to 15B, 15C1 to 15C2 and 15D1 to 15D2 illustrates the tip shapes of side entry-type sample units and light gathering means. Also in the structures in FIGS. 15A to 15B, 15C1 to 15C2 and 15D1 to 15D2, the same effect as in FIG. 14A is obtained by disposing the relevant members such that a tilted central axis is aligned with the surface of the light emitting element 23. That is, observation can be performed without varying light gathering efficiency even when the sample support is tilted. The configuration of the movable sample support unit is also the same as in FIG. 14A.

In common with the configuration in FIG. 14A, the structure of the sample support unit in FIGS. 15A to 15B, 15C1 to 15C2 and 15D1 to 15D2 is configured such that it can be driven by a mechanism portion inserted into the enclosure or the supporting member. It is assumed that: the tilting rotation axis 202 of the sample support unit is an X-axis; the direction in which a charged particle beam is applied is a Z-axis; and the direction orthogonal both to the X-axis and to the Z-axis is a Y-axis. The sample support unit in this case is provided with a conductive film 206 mechanism portion, which is capable of driving the sample support unit 24 in the XY plane or in the Z direction. The sample support unit is provided with a drive mechanism rotatable around the rotation axis 202. In the above description, an example in which a mechanism portion is automatically moved through a control unit is taken but a configuration in which it is manually moved by a user him/herself may be adopted instead. In the case of the sample support unit, the positional relation between the light emitting element 23 and the photodetector 4 is unchanged even when the mechanism portion is rotated around the central axis of the sample support unit to change the irradiation direction of the charged particle beam. For this reason, a tilted sample can be observed more easily than in Example 2.

FIG. 15A shows an elliptic shape and FIG. 15B shows a flat slope shape. When the tip is elliptic, an advantage is brought about by placing point A in FIG. 11 in proximity to the irradiation position of a charged particle beam. It is expected that light generated at the light emitting element will be more effectively transferred toward the detector than with a sloped mirror. Meanwhile, when a sloped mirror is adopted, the structure is simplified and can be more inexpensively fabricated as compared with an elliptical mirror. To further enhance the efficiency of detection of light released from the light emitting element 23, the side wall portions of the tip may also be configured as a rotational ellipsoid or a sloped mirror.

The light emitting element 23 with a sample placed at the tip of the sample support is disposed. Charged particles that were applied to and passed through the sample emit light at the light emitting element 23 and light is released. This light passes through the light transfer path 203 located at a strut portion of the sample support and detected at the photodetector 4 placed in the atmosphere area. The strut portion of the sample support unit is formed of the light transfer path 203 and the surface of the light transfer path 203, other than the light emitting element 23 placement area, is covered with a reflector of aluminum (Al) or the like. In this case, only light released from the lower face of the emitter 23 is gathered. The securing method is the same as in Example 2 and any configuration, including a conductive tape, a double-faced tape, a mechanical fixture, adhesive, and like, as illustrated in FIG. 8 is acceptable.

FIGS. 15C and 15D illustrate examples in which a recess for receiving the light emitting element 23 is formed at the tip of the sample support and the light emitting element is set in the recess. With this configuration, light released from a side face as well as the lower face of the emitter can be gathered and a detected light quantity is increased. To reflect and gather light released from a side face or the lower face of the light emitting element 23, a measure is taken. In the recess portion for receiving the light emitting element 23, the surfaces of the areas other than those joined with the emitter is covered with a reflector 206 of, for example, aluminum (Al).

With a gap between the light emitting element 23 and the light transfer path 203, light generated at the emitter is refracted and light gathering efficiency can be degraded. To avoid this, the light emitting element 23 may be used as a light transfer path.

If the internal space of the sample chamber of a charged particle apparatus is narrow or if such a configuration that a sample is placed in an objective lens, multiple scattering occurs in this space when a charged particle beam is applied. For this reason, a specified area in the light transfer path 203 is covered with a conductive reflector of aluminum (Al) or the like. This provides a charge-up prevention measure for the light transfer path 203 made of a nonconductive material, such as quartz, glass, optical fiber, plastic, or the like. To enhance the charge-up preventive effect, a configuration in which the entire light emitting element 23 is covered with a transparent conducting thin film may be adopted. In the case of this configuration, however, it is required to meet conditions under which a charged particle beam can pass through a sample and the conductive thin film and arrive at the light emitting element 23. The conditions take into account the energy of the charged particle beam applied to the sample and the thicknesses of the sample and the conductive thin film. Examples of desired conditions are approximately 10 nm or below for metal such as Pt and 20 nm or below for ITO and NESA films. In consideration of observation with an optical microscope, the surface of the conductive thin film must be so flat that sample observation will not be influenced.

In the examples in FIGS. 14A to 14E, 15A to 15B, 15C1 to 15C2 and 15D1 to 15D2, the tip of the light transfer path 203 functions as a light gathering means 50. It is desirable to adopt such a configuration that light released from the light emitting element 23 is efficiently reflected toward the transfer path 203. In particular, the tip shape is configured such that light of the emitter 23 released from the light emitting element 23 to a direction different from that to the detector 4 is reflected toward the detector.

To detect light released from a side wall portion of the light emitting element, such a configuration as illustrated in FIG. 15C1 or FIG. 15D1 can be adopted. FIG. 15C2 and FIG. 15D2 respectively show these configurations as perspective views. Any of the light emitting elements shown in FIG. 15A, FIG. 15B, FIG. 15C1, FIG. 15D1, FIG. 15C2, and FIG. 15D2 is secured at the tip of the sample support of a side entry type with a conductive tape 112 or the like as shown in FIGS. 9A to 9C. At this time, it is desirable that the fixture, such as the conductive tape 112, should be so installed as to ensure continuity to a member covered with a conductive material for the prevention of charge-up.

Figure 16A:
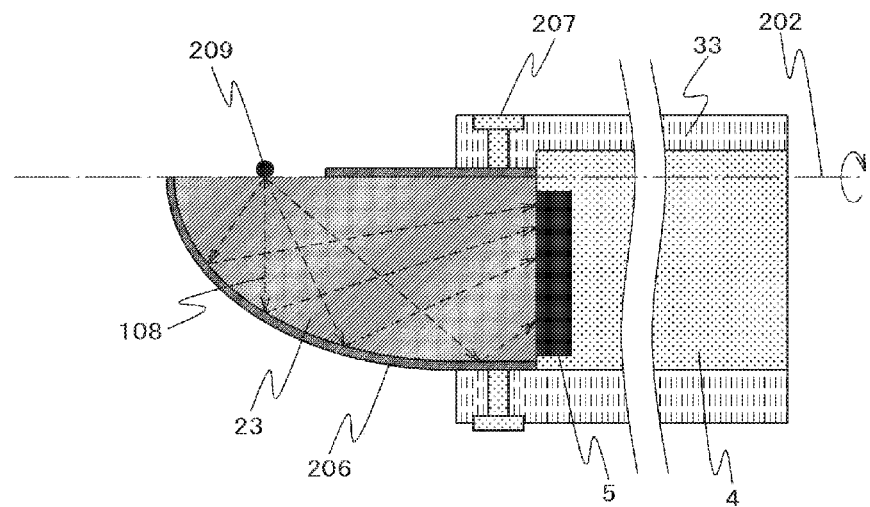
FIGS. 16A to 16B are block diagrams of a sample unit for side entry type in Example 3.
Figure 16B:
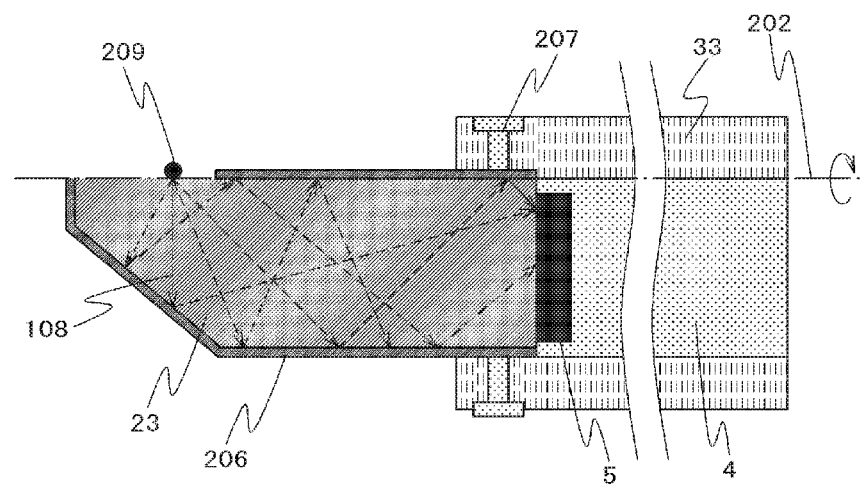

FIGS. 16A to 16B illustrate examples of the configuration of a sample support unit adopted when a large sample chamber cannot be ensured in a side entry type. As illustrated in FIGS. 16A to 16B, the emitter itself is provided with an elliptic or a slope-type reflecting mechanism. The emitter is fit in a recess formed in the support 33 and the light emitting element 23 and the support 33 are mechanically secured together with a fixture 207. Then the light emitting element 23 and the photodetector 4 are installed in contact with each other. As a result, a ray of emitted light 108 passes through the light emitting element 23 using the light emitting element 23 itself as a light transfer path and is gathered to the detector. Though not shown in the drawings, a configuration in which the light transfer path 203 is placed between the light emitting element 23 and the photodetector 4 is also acceptable. In the case of this configuration, when a small-sized photodetector 4 is used as illustrated in FIGS. 16A to 16B, light can be more effectively focused by taking the following measure: the emitter 23 portion is aligned with the rotation axis 202 of a rotational ellipsoid; the irradiation position 209 of a charged particle beam is matched with one focal point and is placed such that the position is aligned with the detection surface 5 of the small-sized photodetector 4 or the take-in port of the light transfer path. For the gap between the light emitting element 23 and the light transfer path 203, it is desirable to use optical cement or the like to prevent a steep change in refraction index. The detection surface 5 may be positioned in proximity to the light emitting element as illustrated in FIGS. 16A and 16B. Alternatively, though not shown in the drawings, a configuration in which released light 108 passes through the light transfer path and is detected at the photodetector 4 may be adopted.

When the photodetector 4 is installed at an end of the sample unit in proximity to the handle of a side entry stage, the following measure may be taken to efficiently reflect released light 108 toward the photodetector 4: variation in refraction index between the light emitting element 4 and the light transfer path 203 is utilized. This configuration can also be considered as a part of the light gathering means 50.

Even with the structure of the sample support unit in FIGS. 16A to 16B, the following can be implemented by aligning the tilted central axis with the surface of the light emitting element 23: even when the sample support is tilted as in FIG. 14A, observation can be performed without varying light gathering efficiency. The configuration of the movable sample support unit is the same as in FIG. 14A.

With respect to a method for moving the sample support unit structure in FIGS. 16A to 16B, like the configuration in FIG. 14A, the structure can be driven by a mechanism portion inserted into the enclosure or the supporting member. It is assumed that: the tilting rotation axis 202 of the sample support unit is an X-axis; the direction in which a charged particle beam is applied is a Z-axis; the direction orthogonal both to the X-axis and the Z-axis is a Y-axis. The sample support unit 24 can be driven in the XY plane or in the Z direction by this mechanism portion. The sample support unit is provided with a drive mechanism rotatable around the rotation axis 202. In the above description, an example in which a mechanism portion is automatically moved through a control unit but a configuration in which it is manually moved by a user him/herself may adopted instead. In the case of the sample support unit, the positional relation between the light emitting element 23 and the photodetector 4 is unchanged even when the mechanism portion is rotated around the central axis of the sample support unit to change the irradiation direction of the charged particle beam. For this reason, a tilted sample can be observed more easily than in Example 2.

Figure 17A:
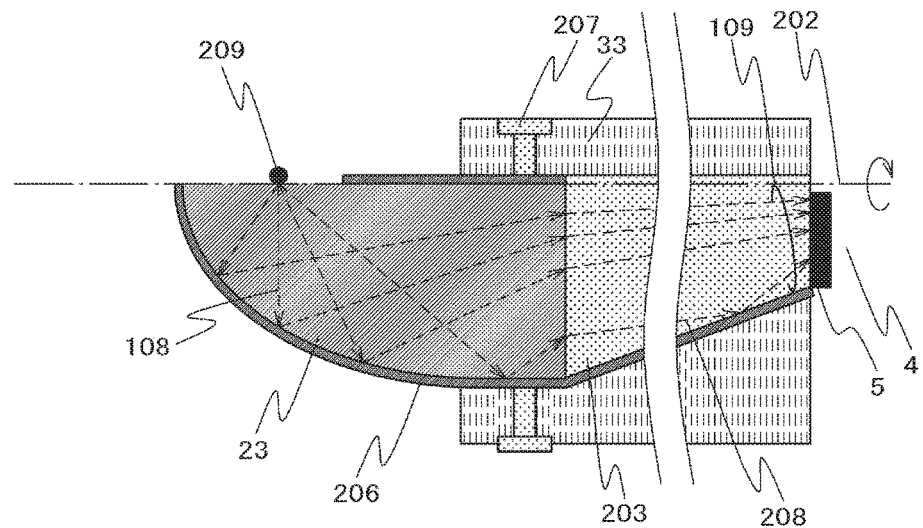
FIGS. 17A to 17B are block diagrams of a sample unit for side entry type in Example 3.
Figure 17B:
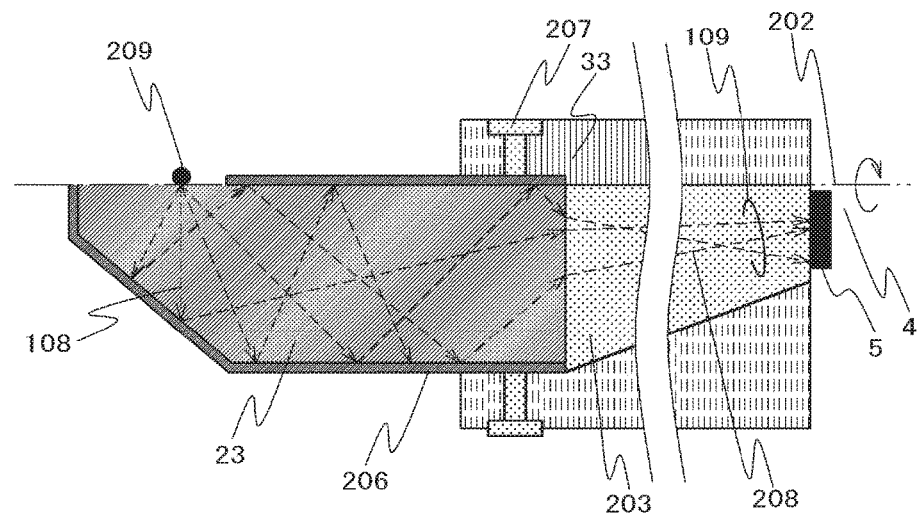

FIGS. 17A and 17B illustrate a configuration and a light gathering means adopted when the detection surface 5 of the photodetector 4 is smaller than the sample support unit 24. When it is necessary to use a light guide as the light transfer path 203 and detect light from the light emitting element 23 with a photodetector 4 having a small detection surface 5, the following measure is taken: the light guide is configured such that the area between the detection surface at a joint of the light emitting element 23 and the detection surface 5 of the photodetector 4 is enclosed with a gentle taper angle; and the surface of the tapered portion is covered with a reflector 206 of a metal thin film or the like. Thus, emitted light from the light emitting element can be gathered 109 and thus improvement of light collecting efficiency is expected.

When a transmitted charged particle beam image is acquired with a side entry-type sample support unit 24 in this example in stereoscopic observation or three-dimensional observation of the internal information of a sample, the following should be taken into account: to prevent a detected light quantity from depending on a tilt angle, as illustrated in FIGS. 17A to 17B, it is desirable that the sample rotation axis 202 should be parallel to the longitudinal axis of the sample support and be matched with a straight line running through the vicinity of the surface of the light emitting element with a sample placed thereon.

Also with the structure of the sample support unit in FIGS. 17A-17B, an advantage is brought about by placing the central axis on the surface of the light emitting element 23 during tilting. Even when the sample support is tilted as in FIG. 14A, observation can be performed without varying light gathering efficiency. The configuration of the movable sample support unit is the same as in FIG. 14A.

The sample support unit structure in FIGS. 17A to 17B, in common with the configuration in FIG. 14A, is configured such that the same can be driven by a mechanism portion inserted into an enclosure or a supporting member. It is assumed that: the tilting rotation axis 202 of the sample support unit is an X-axis; the direction in which a charged particle beam is applied is a Z-axis; and the direction orthogonal both to the X-axis and to the Z-axis is a Y-axis. The sample support unit 24 can be driven in the XY plane or in the Z direction by this mechanism portion. A drive mechanism rotatable around the rotation axis 202 of the sample support unit is provided. In the above description, an example in which a mechanism portion is automatically moved through a control unit is taken but a configuration in which it is manually moved by a user him/herself may be adopted instead. In the case of the sample support unit, the positional relation between the light emitting element 23 and the photodetector 4 is unchanged even when the mechanism portion is rotated around the central axis of the sample support unit to change the irradiation direction of the charged particle beam. For this reason, a titled sample can be observed more easily than in Example 2.

Figure 18:
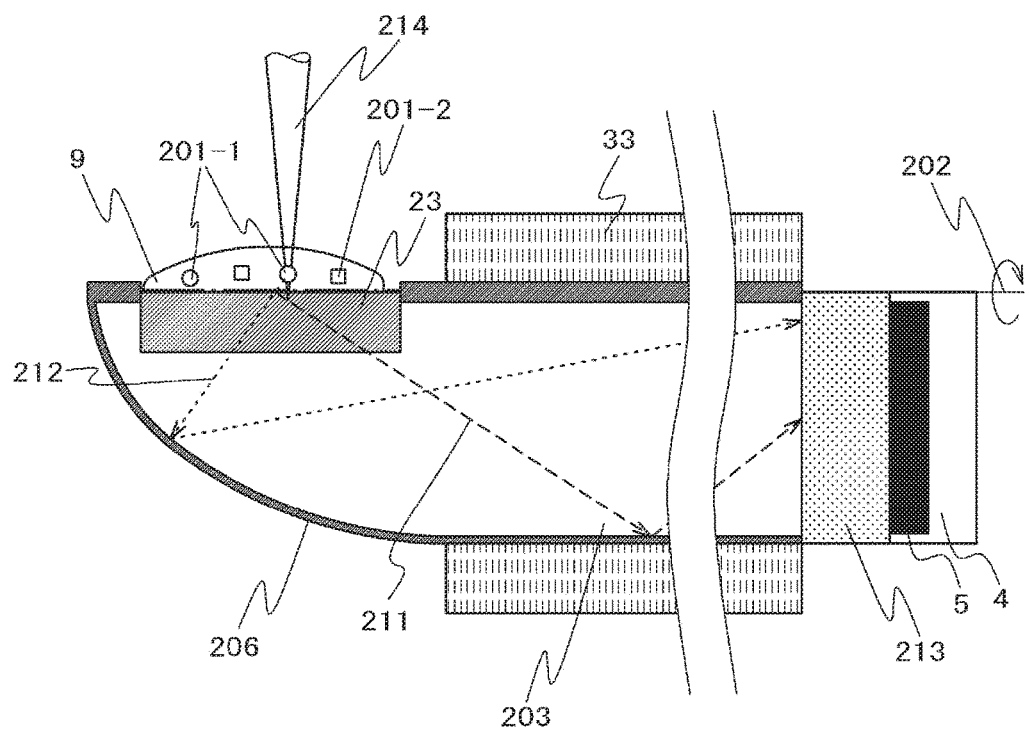
FIG. 18 is a block diagram of a sample unit for side entry type in Example 3.

FIG. 18 illustrates an example of a configuration of a method for introducing stain into a specific region in a cell sample and obtain the information of distribution thereof using the configuration in FIG. 15C. A description of the common configurations described with reference to FIGS. 15A to 15B, 15C1 to 15C2 and 15D1 to 15D2 will be omitted. Such configurations include the light emitting element 23, the reflector 206, the detection system for detecting detection signals, and the like. To observe a cell sample using a sample support of a side entry type in this example illustrated in the drawing, the following stain 210-1 is introduced: stain for charged particle microscopes with which light emission in a specific wavelength is caused when a charged particle beam is applied by the same method as for stain used in optical microscope observation. When a charged particle beam 35 is applied as illustrated in FIG. 18, two different types of light are both detected by the photodetector 4: light 211 (broken line in the drawing) released by the light emitting element 23 being irradiated with the transmitted charged particles; and light 212 (dotted line in the drawing) released when each stain 201-1 is irradiated with the charged particle beam. If two different types of light can be separately detected with a spectroscopic means 213, such as a spectroscope and a wavelength filter, it is possible to obtain a distribution image in a specific region as well as a transmission image by transmitted charged particles 214. With this configuration, multiple kinds of stain, like stain 210-2, may be introduced to be excited by a charged particle beam as long as their wavelengths can be discriminated by the spectroscopic means 213 and detected as different optical signals. The configuration of the sample unit is applicable to FIGS. 15A to 15B, 15C1 to 15C2 and 15D1 to 15D2, FIGS. 16A to 16B, and FIGS. 17A to 17B.

Also with the structure of the sample support unit in FIG. 18, an advantage is brought about in common with the examples in FIGS. 14A to 14E. By placing the central axis on the surface of the light emitting element 23 during tilting, observation can be performed without varying light gathering efficiency. The configuration of the movable sample support unit is the same as in FIG. 14A.

In this example, the installation location of the photodetector is limited to the interior of the sample unit. Using a light transmitting means, such as an optical fiber, between the light transferring portion and the photodetector makes it possible to place the photodetector outside the sample unit. Therefore, it is obvious that the effect of this example is similarly obtained.

The sample support unit structure in FIG. 18, in common with the configuration in FIG. 14A, is configured such that the same can be driven by a mechanism portion inserted into an enclosure or a supporting member. It is assumed that: the tilting rotation axis 202 of the sample support unit is an X-axis; the direction in which a charged particle beam is applied is a Z-axis; and the direction orthogonal both to the X-axis and the Z-axis is a Y-axis. The sample support unit 24 can be drive in the XY plane or in the Z direction by this mechanism portion. The sample support unit is provided with a drive mechanism rotatable around the rotation axis 202. In the above description, an example in which a mechanism portion is automatically moved through a control unit but a configuration in which it is manually moved by a user him/herself may be adopted instead. In the case of the sample support unit, the positional relation between the light emitting element 23 and the photodetector 4 even when the mechanism portion is rotated around the central axis of the sample support unit to change the irradiation direction of the charged particle beam. For this reason, a tilted sample can be observed more easily than in Example 2.

REFERENCE SIGNS LIST

1: Lens,
2: Charged particle beam microscope,
3: Charged particle optical lens tube,
4: Photodetector,
5: Detection surface,
7: Vacuum pump,
8: Sample stage,
9: Sample,
10: Enclosure,
11: Primary charged particle source,
12: Leak valve,
13: Vacuum pipe,
14: Computer,
15: Higher-level control unit,
16: Lower-level control unit,
17: Communication wire,
18-1: Operation knob,
18-2: Operation knob,
20: Vacuum sealing member,
21: Supporting member,
22: Lid member,
23: Light emitting element,
24: Sample support unit,
25: Sample support,
26: sample support supporting strut,
27: Sample support supporting base, 28: Amplifier,
29: Optical microscope,
30: Retaining jig,
31: Base,
32: O ring,
33: Support (non-magnetic material),
34: Handle,
35: Primary charged particle beam,
36: Charged particle beam apparatus,
37: Signal wire,
38: Detector,
39: Preamplifier,
40: Opening,
50: Light gathering means,
51: Condensing convex lens,
54: Fresnel lens,
56-1, 56-2, 56-3, 56-4: Light gathering mirror,
61: Side mirror,
62: Elliptical mirror,
64: Light transfer path,
65: Reflecting cylindrical mirror,
66: Passage port,
100: High-density portion,
101: Low-density portion,
102: Large internal substance,
103: Internal substance,
106: Optical axis,
108: Emitted light,
109: Gathered light,
110: Emitted light released from side portion of emitter,
112: Conductive tape,
113: Double-faced tape,
114: Retaining jig,
151: Projection image,
152: Projection image (or detection image),
153: Transmission image,
154: Motion space,
200: Objective lens of charged particle beam apparatus,
201: Side entry-type sample stage,
202: Tilting rotation axis of side entry-type sample stage,
203: Light transfer path,
204: Light guide,
205: Optical fiber,
206: Conductive thin film as optical reflector,
207: Fixture of emitter,
208: Light refracted in boundary between emitter and light transferring means,
209: Irradiation position of charged particle beam,
210-1: Fluorescent substance A,
210-2: Fluorescent substance B,
211: Light released from fluorescent substance by application of charged particle beam,
212: Light released from emitter by application of charged particle beam,
213: Spectroscopic means,
214: Charged particle beam,
215: Light emitting member placement portion,
216: Mechanism portion,
217: Supporting member.

The invention claimed is:

1. A sample holder comprising:
a sample placement portion on which a light emitting member caused to emit light by charged particles that have traversed or scattered inside the sample; and
a light transferring member constituting a light transfer path for transferring light launched from a face non-parallel to a face of the light emitting member on which the sample is placed toward a detector.

2. The sample holder according to claim 1, wherein the face non-parallel to the face on which the sample is placed is a side face of the light emitting member.

3. The sample holder according to claim 1, wherein the light emitting member and the light transferring member are integrally moved.

4. The sample holder according to claim 3, wherein the light transferring member is synchronized with tilting and movement of the light emitting member.

5. The sample holder according to claim 1, wherein a detector for detecting light transferred by the light transferring member is provided.

6. The sample holder according to claim 5, wherein the light emitting member, the light transferring member, and the detector are integrally moved.

7. The sample holder according to claim 1, wherein the light transferring means includes a light gathering means for gathering light from the light emitting member.

8. The sample holder according to claim 7, wherein the light gathering means is a reflecting member reflecting light that comes from the light emitting member and does not go directly to a detector and directing the same toward the detector.

9. The sample holder according to claim 8, wherein the reflecting member is in a shape forming at least a part of an ellipse embracing the light emitting member and the light emitting member and the detector are disposed so as to embrace two focal point positions of the ellipse.

10. The sample holder according to claim 1, wherein the light transfer path includes a spectroscopic means that separates light generated at the light emitting member according to wavelengths.

11. The sample holder according to claim 5, wherein a launching face from which light from the light emitting member is launched is larger than a detection surface of the detector and a tapered light transferring means is provided between the light emitting member and the detector.

12. An image generation method comprising the steps of:
applying a charged particle beam to a sample placed on a light emitting member caused to emit light by charged particles;
launching light generated from the light emitting member by charged particles that have traversed or scattered inside the sample from a face non-parallel to a face of the light emitting member on which the sample is placed;
transferring the launched light toward a detector;
detecting the transferred light with the detector; and
generating an image of the sample based on a signal from the detector.

13. The image generation method according to claim 12, comprising the step of:
integrally moving the light emitting member and a light transferring member constituting a light transfer path for transferring light generated from the light emitting member toward the detector.

14. A sample holder comprising:
- a sample placement portion on which a light emitting member caused to emit light by charged particles that have traversed or scattered inside a sample is placed; and
- a light gathering means for gathering light from the light emitting member toward a detector.

15. The sample holder according to claim 14, wherein the light emitting member and the light gathering means are integrally moved.

16. The sample holder according to claim 14, wherein a support for supporting the light emitting member is provided, and
wherein the light gathering means is formed in the support.

17. The sample holder according to claim 14, wherein a reflecting member that reflects emitted light from between the face of the light emitting member on which the sample is placed and a face on the side where the light gathering means is placed and directs the same toward the light gathering means is provided.

18. The sample holder according to claim 14, wherein the light gathering means is a reflecting member reflecting light that comes from the light emitting member and does not go directly to a detector and directing the same toward the detector.

* * * * *